United States Patent
Song

(10) Patent No.: US 11,694,751 B2
(45) Date of Patent: Jul. 4, 2023

(54) LOGIC COMPATIBLE FLASH MEMORY PROGRAMMING WITH A PULSE WIDTH CONTROL SCHEME

(71) Applicant: Seung-Hwan Song, Palo Alto, CA (US)

(72) Inventor: Seung-Hwan Song, Palo Alto, CA (US)

(73) Assignee: SEMIBRAIN INC., Seongnam-si (KR)

( * ) Notice: Subject to any disclaimer, the term of this patent is extended or adjusted under 35 U.S.C. 154(b) by 195 days.

(21) Appl. No.: 16/951,927

(22) Filed: Nov. 18, 2020

(65) Prior Publication Data

US 2021/0166763 A1 Jun. 3, 2021

Related U.S. Application Data

(60) Provisional application No. 62/942,086, filed on Nov. 30, 2019.

(51) Int. Cl.
*G11C 16/34* (2006.01)
*G11C 16/10* (2006.01)

(52) U.S. Cl.
CPC .......... *G11C 16/10* (2013.01); *G11C 16/3459* (2013.01)

(58) Field of Classification Search
CPC ................................................. G11C 16/3427
See application file for complete search history.

(56) References Cited

U.S. PATENT DOCUMENTS

2012/0081962 A1* 4/2012 Tsai ................... G11C 16/3427
365/185.15

\* cited by examiner

*Primary Examiner* — Jason Lappas

(57) ABSTRACT

A selective non-volatile memory programming method for a selected memory cell in a memory array is described so as to reduce or avoid program disturbance on an unselected memory cell. This selective programming method comprises: applying a programming pulse to a selected memory cell to be programmed and an unselected memory cell, wherein the programming pulse allows a change of the unselected memory cell within a range specified; boosting a region of the unselected memory cell; and setting a threshold time of the programming pulse, wherein the threshold time is defined when an absolute magnitude of a voltage difference between a floating gate of the unselected memory cell and the boosted region of the unselected memory cell reaches a threshold value defined.

10 Claims, 16 Drawing Sheets

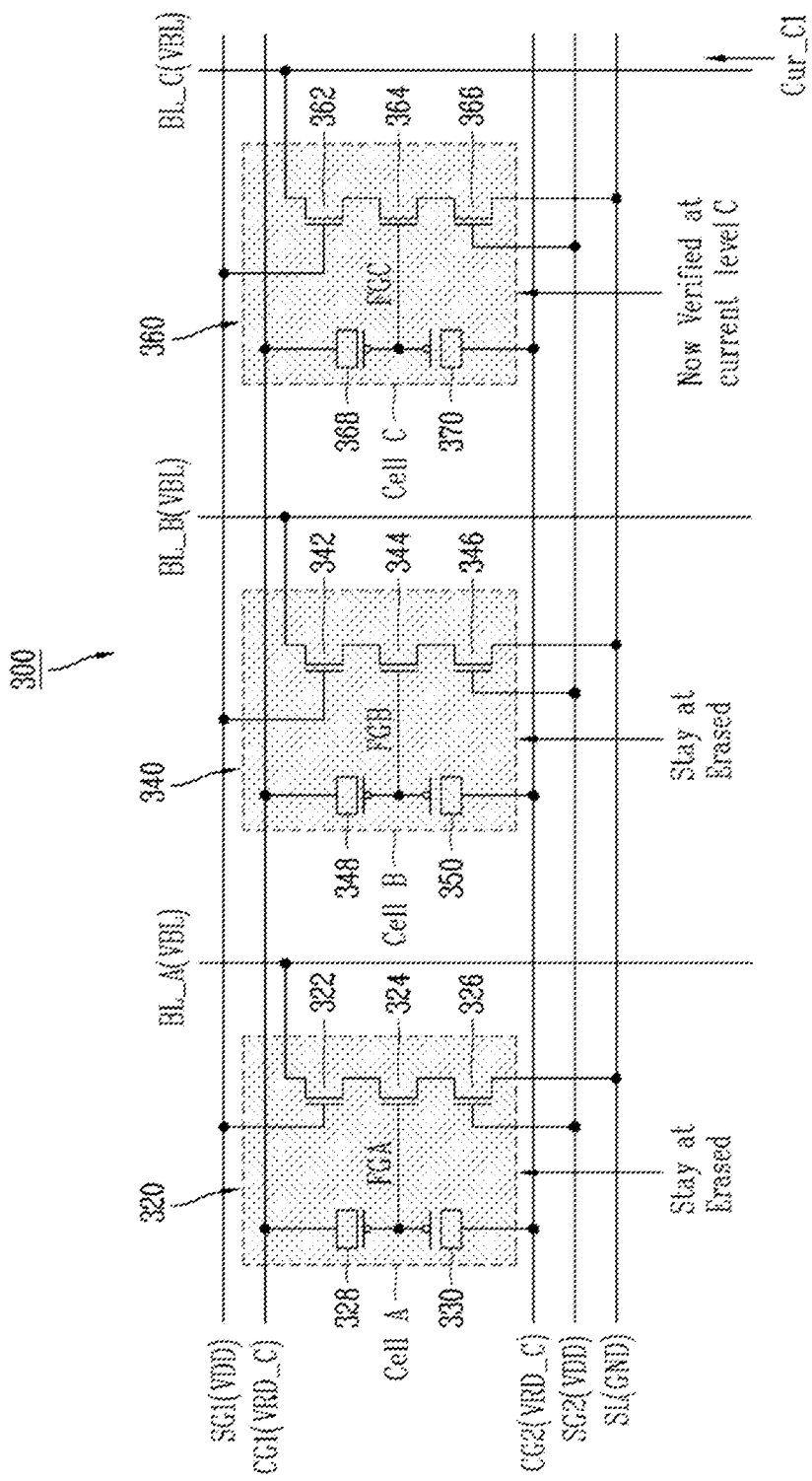

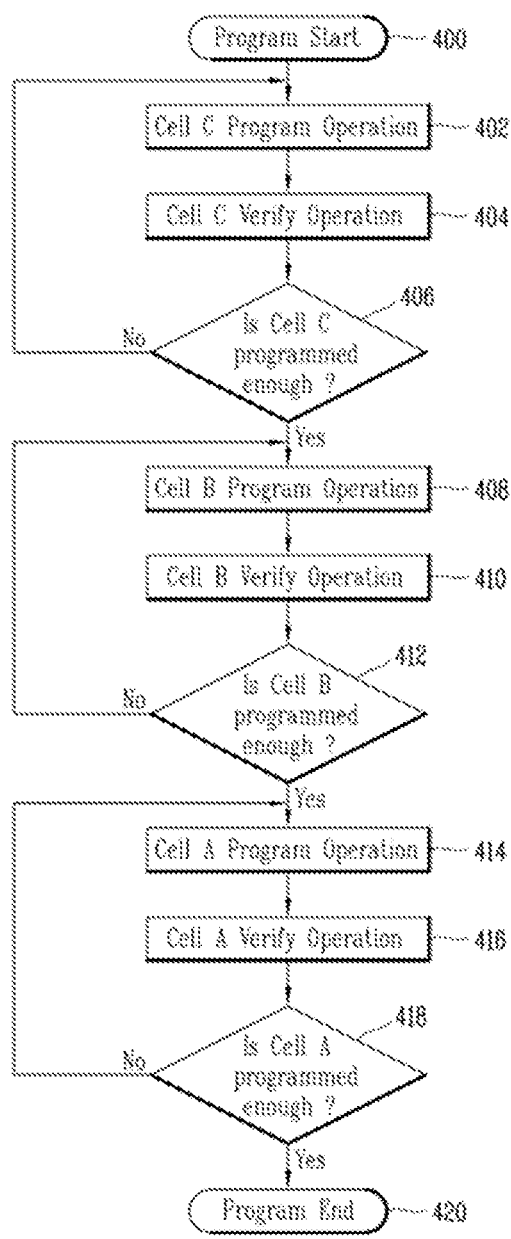

LOGIC COMPATIBLE FLASH MEMORY PROGRAMMING WITH A PULSE WIDTH CONTROL SCHEME

CROSS-REFERENCE TO RELATED APPLICATIONS

This application claims the benefits of U.S. Provisional Application Ser. No. 62/942,086, filed on Nov. 30, 2019, entitled "Accurate Synapse Programming Method."

TECHNICAL FIELD OF THE INVENTION

The present invention relates to non-volatile memory technology. Specifically, this invention describes a program pulse width control scheme of the logic compatible flash memory that can flow the memory cell current within a specified target current range.

BACKGROUND OF THE INVENTION

Flash memory is a typical non-volatile memory that can store information permanently even though the system power is off. The logic compatible flash memory is a type of flash memory built with only logic devices. FIG. 1 illustrates a conventional memory cell array 100 in 2D of rows and columns. This memory cell array 100 structure comprises multiple rows and columns of logic compatible flash memory cells, i.e., "Cell A1", "Cell A2" and "Cell A3" through "Cell C1", "Cell C2", and "Cell C3". Bit lines run alongside the cells connecting the columns. Each bit line connects the cells in the same column to one sense amplifier circuit located at the end of the column. This memory cell can modulate its current level based on the stored information in the cell. The sense amplifier determines the cell status by sensing the current level. Even if not depicted in FIG. 1, there is a set of control lines (read line) connected to Cells A, Cells B, and Cells C arrayed in each row for memory operations, such as discharging or discharging the memory cells. Given this memory cell array, when a programming operation is selectively performed for only some memory cells and when those cells (i.e., the Cells A1, B1 and C1) shares the common read line, the unselected memory cell (e.g., Cell C1) should not be affected by the program operation of the selected memory cells (e.g., Cell A1 and Cell B1) and its original state must be preserved.

SUMMARY OF INVENTION

This invention discloses a method of selectively programming a non-volatile memory composed of standard logic devices. According to the present invention, the method of programming a non-volatile memory cell in a memory array, comprising: applying a pre-defined programming pulse to both a selected memory cell to be programmed and an unselected memory cell not be altered, or even if altered in a certain degree, the unselected memory cell is only altered within an allowable range specified, by the programming of the selected memory cell; boosting a region of the unselected memory cell; and setting a threshold time of the programming pulse, wherein the threshold time is defined when an absolute magnitude of a voltage difference between a floating gate of the unselected memory cell and the boosted region of the unselected memory cell reaches a threshold value defined.

In one embodiment, the method further comprises: applying a programming pulse to an unselected memory cell in the array until the threshold time; and boosting a voltage potential of the unselected memory cell until the threshold time. In one embodiment, the programming pulse begins to ramp down to a ground potential at or near the threshold time. Also, in another embodiment, the threshold value is a maximum voltage difference between a floating gate of the unselected memory cell and the boosted region of the unselected memory cell to inhibit unwanted programming of the unselected memory cell.

In one embodiment, the pre-defined programming pulse is applied to a gate line connecting the selected memory cell and the unselected memory cell. In another embodiment, the boosted region of the unselected memory cell includes a source region, a drain region, and a channel region between the source and the drain regions of the unselected memory cell, formed on the corresponding substrate. In one embodiment, the boosted region is boosted to a specific voltage level by a voltage potential on the floating gate of the unselected memory cell. In another embodiment, a voltage level of the pre-defined programming pulses is set low enough such that a voltage difference between a floating gate and a boosted node of the unselected memory cell is low enough to prevent a programming of unselected memory cell, while the selected memory cell is being programmed.

In one embodiment, a duration of the pre-defined programming pulse is maintained to be long enough after a ramp-up and before a ramp-down as long as the predefined programming pulse is lowered to at or near the ground potential at or near the threshold time. In one embodiment of the present invention, a non-volatile memory device comprises: a voltage signal pulse generator to apply a pre-defined programming pulse; and, a non-volatile memory cell array. In one embodiment, the voltage signal pulse generator is configured to generate signals to a non-volatile memory cell in a memory array with a pre-defined programming pulse to both a selected memory cell to be programmed and an unselected memory cell not to be altered, or even if altered in a certain degree the unselected memory cell is only altered within a specified range, by the programming of the selected memory cell by the programming of the selected memory cell. In another embodiment, the voltage signal pulse generator is further configured to set a threshold time of the pre-defined programming pulse, wherein the threshold time is defined when an absolute magnitude of a voltage difference between a floating gate of the unselected memory cell and the boosted region of the unselected memory cell reaches a threshold value defined.

BRIEF DESCRIPTION OF THE DRAWINGS

Features of the present invention will become apparent to those skilled in the art from the following description with reference to the drawings. Understanding that the drawings depict only typical embodiments of the invention and are not, therefore, to be considered limiting in scope, the invention will be described with additional specificity and detail through the use of the accompanying drawings, in which.

DETAILED EXPLANATION OF THE INVENTION

Figure 1:
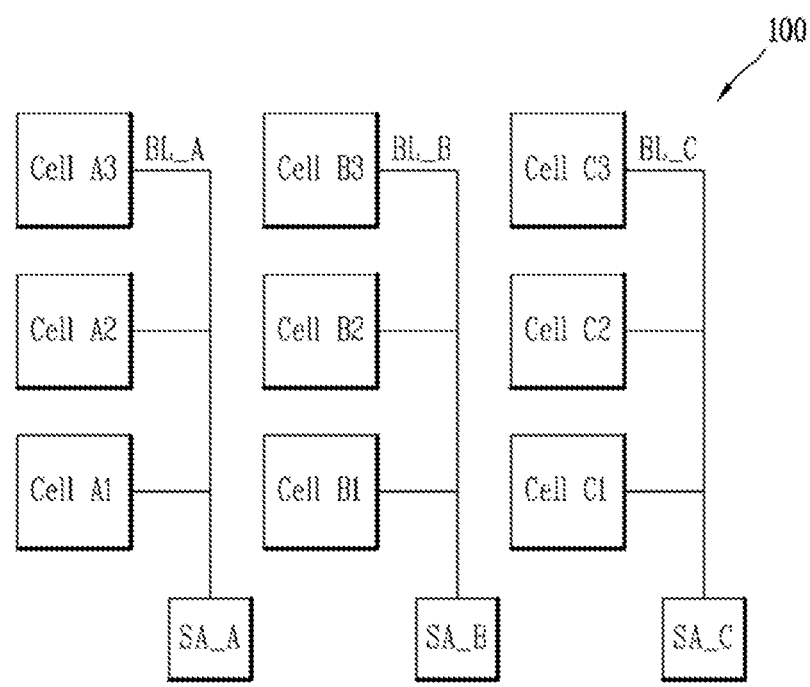
FIG. 1 illustrates a nonvolatile memory cell array structure having multiple rows and columns.
Figure 2A:
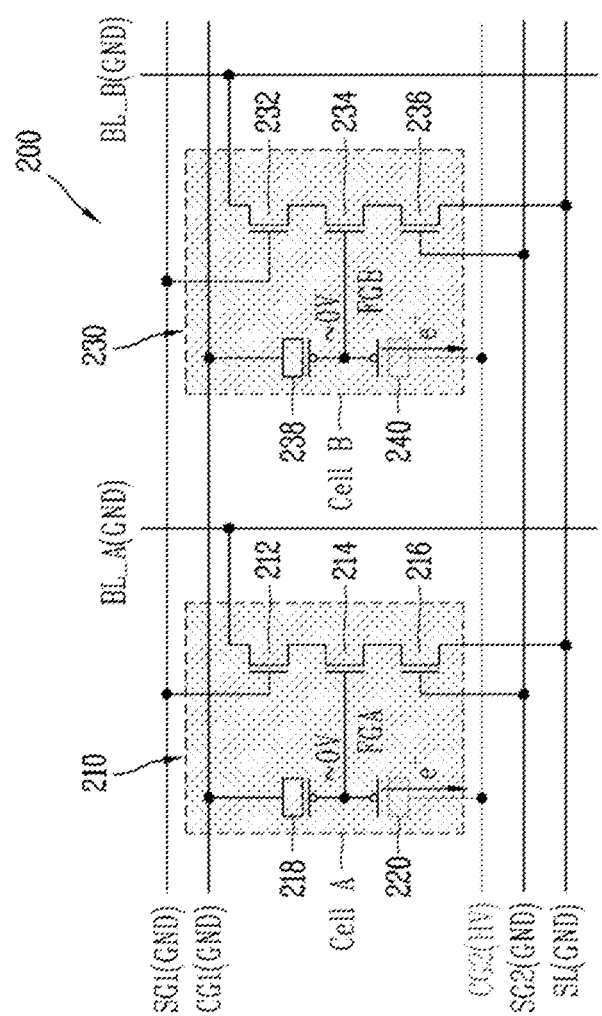
FIGS. 2A and 2B show a circuit diagram of biased logic compatible flash memory cell for selective programming based on a self-boosting inhibit scheme according to an embodiment of the present invention.
Figure 2B:
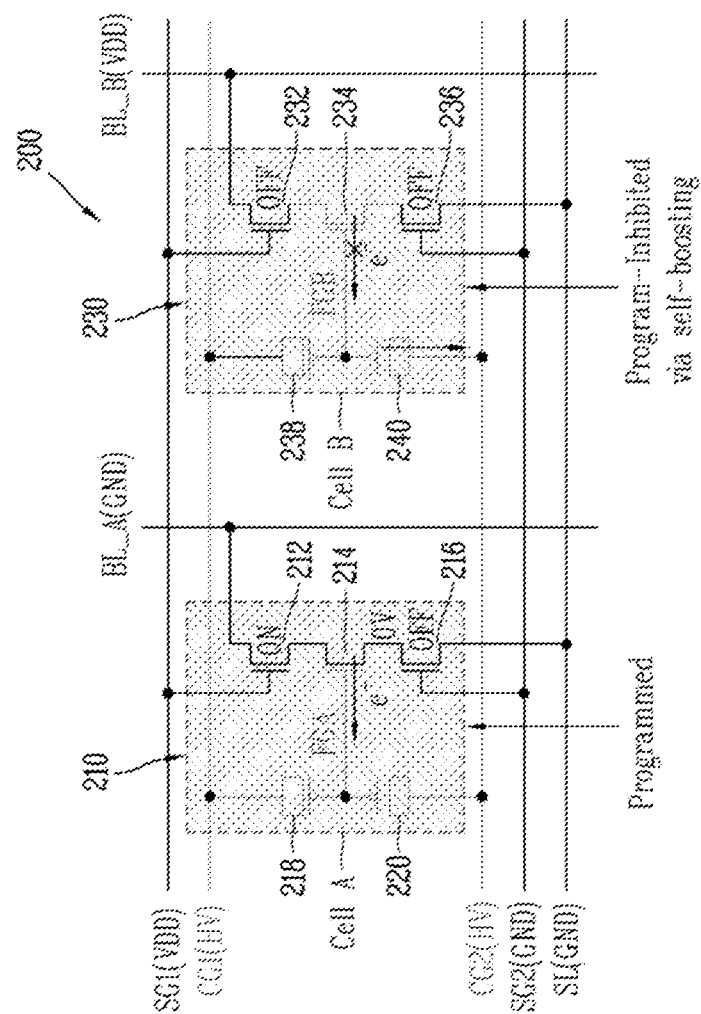

FIGS. 2A and 2B show a circuit diagram depicting two logic compatible flash memory cells arranged in the same row for erasing and program operations. Each memory cell in FIGS. 2A and 2B can be the memory cell depicted in FIG. 1. This flash memory cell is logic compatible because all the unit devices in the cell are built using standard logic devices. FIG. 2A shows the memory cells biased for an erase operation. FIG. 2B shows the memory cells biased for a programming operation.

Each of memory Cells A and B includes a drain-select transistor 212/232, a source select transistor 216/236, and a read transistor 214/234 coupled to a pair of control gates 218,220 (for the Cell A) and 238,240 (for the Cell B). The Cells A and B share the control gate lines CG1/CG2, the select gate lines SG1/SG2, and the source line SL in a row. However, the Cell A and B are connected to its respective bit lines BL_A, BL_B, respectively. The Cell A is connected to a bit line BL_A via a drain-select transistor 212. The Cell B is connected to a bit line BL_B via a drain-select transistor 232. A read transistor 214 in the Cell A is connected to a pair of control gate transistors 218,220 forming a floating gate FGA. The read transistor 234 in the Cell B is connected to a pair of control gate transistors 238,240 forming a floating gate FGB. Further, upper control gate transistors 218 and 238 connected to an upper control gate line CG1 are upsized as compared to lower control gate transistors 220, 240 connected to a lower control gate line CG2. As a result, voltage potentials of the floating gates FGA, FGB are maintained to a close voltage of the first control gate line CG1.

The floating gate FGA in the Cell A and the floating gate FGB in the Cell B capacitively are coupled to their corresponding control gates: the control gates 218, 220 for the Cell A, and the control gates 238,240 for the Cell B. Thus, the Cells A and B each can store data in the form of a threshold voltage, the lowest voltage at which the corresponding cell can be switched on. The threshold voltage is controlled by the amount of charge that is retained on the floating gates FGA for the Cell A, FGB for the Cell B. That is, a certain level of voltage must be applied to the control gate lines CG1 and CG2 depending on a level of charge on the floating gates FGA and FGB before the read transistor is turned on to permit conduction between its source and drain, the current flowing between the select transistors for each of the Cells A and B during the read operation. The floating gates FGA and FGB can store two or more than two states. Regarding the two states, the Cells A, B can be either programmed or erased. When the Cells A and B are in the fully erased state, a scarce number of electrons are trapped in the Floating Gate (FG) node in each of the Cells A and B; therefore, the cell can flow large amounts of current during the read operation. When the cell is in the fully programmed state, plenty of electrons are stored in the FG node of the logic compatible flash memory cell; therefore, the cell flows small amounts of current during the read operation.

FIG. 2A shows both memory cells A and B's biased conditions for an erase operation. The erase operation happens through the process of removing electrons on the floating gates in each memory cell. For this circumstance, a high, positive voltage HV (approximately +10 V) is applied to the select gate line CG2, and a ground voltage is applied to the select gate line CG1. The upper control gates 210,230 both being connected to CG1 are significantly larger in size than the lower control gates 220, 240 both being connected to CG2. Thus, the upper gates' voltage causes the FG node voltage potentials to be close to a ground voltage potential. Consequently, the voltage difference between the lower control gate, and this nearly grounded voltage potential of the floating gate is sufficient to repel the trapped negative changes inside the floating gate through the low control gates.

FIG. 2B shows the flash memory cell bias conditions for a selective programming using a self-boosting inhibit scheme. Here, both the memory cells A and B share the row signal lines SG1, CG1, CG2, SG2, SL. The Cell A is biased to be programmed and the Cell B is boosted not to be affected by the programming of the Cell A. For this selective programming scheme, the high program voltage HV is applied to the control gates. The specific supply voltage VDD is applied to a first select gate SG1 and the source line SL. GND level is applied to a second select gate SG2. To program the Cell A1, a drain-select transistor 212 in the Cell A1 is set to be turned on, a bit line (i.e., BL_A) is grounded, and a power supply potential VDD is applied to a gate of the drain-select transistor 212 in the Cell A1. As a result, the drain-select transistor 212 in the memory cell A1 is biased in a conductive state (i.e., "on"). A source-select transistor 216 in the Cell A is turned off by grounding the gate of the transistor. Then, a voltage difference between a floating gate FGA of the Cell A and an electron channel of a read transistor 214 in the Cell A becomes sufficiently high when a programming voltage HV (i.e., nearly 8V) is applied to control gate lines CG1 and CG2. Consequently, the electrons are injected into the floating gate FGA by Fowler-Nordheim tunneling, and when electrons accumulate there, the floating gate is negatively charged, then the threshold voltage of the Cell A is raised. The threshold voltage of the Cell A1 is indicative of a programmed state in response to the stored electrons.

The Cell B is an unselected memory cell from the programming. Thus, the Cell B is biased to keep its original memory status (bit information), not to be altered, or even if altered in a certain degree it is only altered within an allowable range specified, by the program operation of the Cell A. For this purpose, the bit line BL_B and the gate of a drain-select transistor 232 in the Cell B are set to the power supply voltage VDD, therefore turning off the drain-select transistor 232. A source-select transistor 236 in the Cell B is also set to be turned off. The source-select transistor 236 is turned off as its gate is grounded via SG2 line while its source receives VDD, which is higher than 0V. Consequently, the electron channel under a read transistor 234 is electrically isolated by turning off the drain-select transistor 232 and source-select transistor 236. When it occurs, the source, drain, and electron channel of a read transistor 234 in the Cell B1 become electrically isolated from the bit line BL_B and enters a "floating state." The read transistor 234 is capacitively coupled to a large area of a floating gate FGB, charged by control gates CG1 and CG2. Thus, in response to the programming voltage on CG1 and CG2, the read transistor 234 will be self-boosted to a high enough voltage level that inhibits unwanted programming of the Cell B1 by reducing the voltage difference that is lower than a minimum voltage for enabling injection of the electrons into the floating gate FGB. The electron channel boosts up to at or nearly a half of the supply voltage HV (i.e., a half of almost 8 volts: 4 volts). In this bias condition, the voltage difference between a floating gate FGB and the electron channel is intended to be small enough to inhibit the electron tunneling from the electron channel to the FGB. Nevertheless, a certain amount of unwanted electron tunneling may still happen due to the voltage difference between a floating gate FGB and the electron channel. Thus, the state of the Cell B may be altered to a certain level (i.e., disturbed), and when it exceeds a predefined threshold defined by the sense amplifier (depicted in FIG. 1), then the sense amplifier circuit may output an incorrect value during a read operation on the Cell. If the altered level doesn't exceed the predefined threshold, however, then the sense amplifier circuit having high enough precision may still output a correct value during the read operation. Note that the sense amplifier circuit having higher precision is more complex and larger than the one having lower precision. Thus, it is preferred to limit or reduce the amount of the unwanted electron tunneling causing a disturbance during the program operation such that a less complex and compact sense amplifier can be used to sense a correct output from the Cell during its read operation.

Figure 3A:
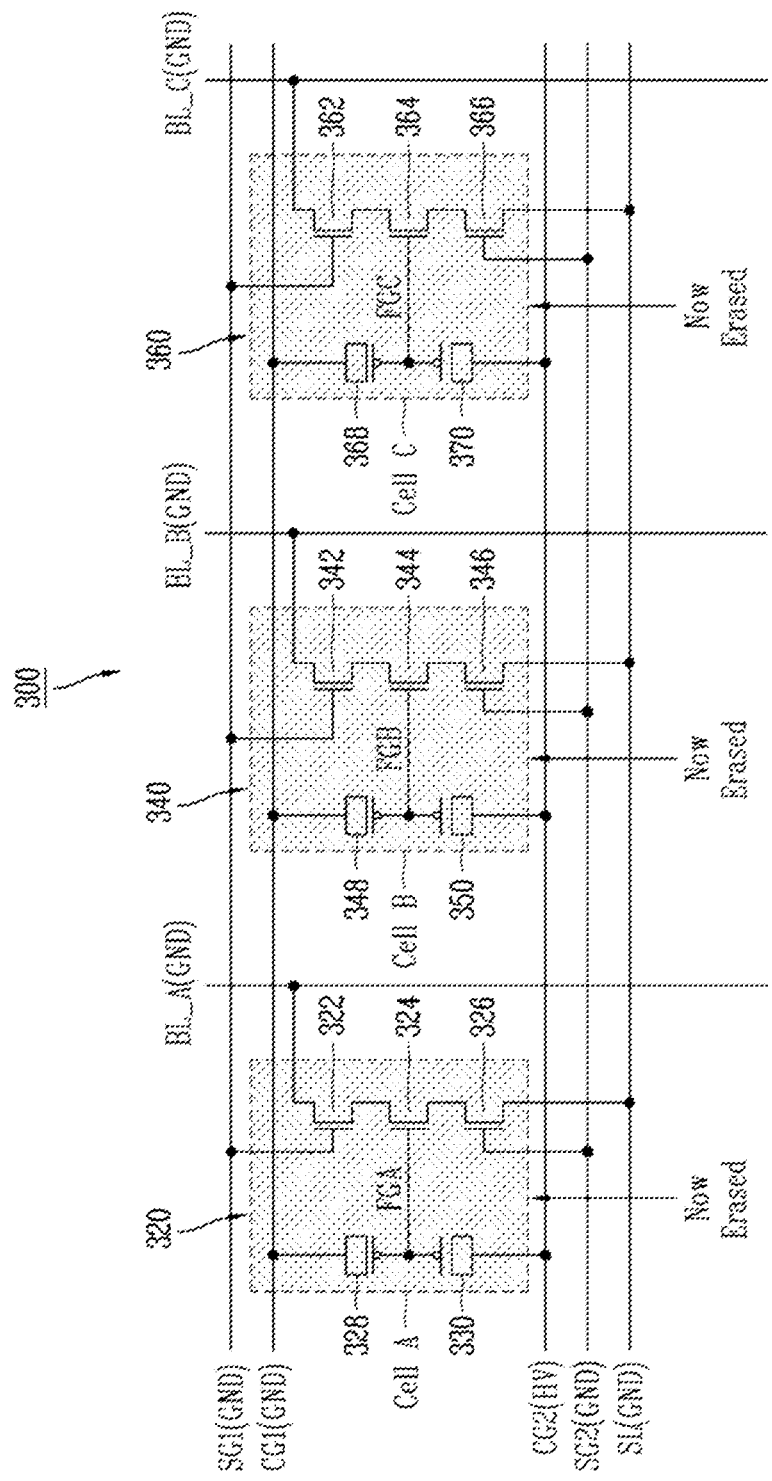
FIGS. 3A-3H show another circuit diagram of biased logic compatible flash memory cell for selective programming based on a self-boosting inhibit scheme according to an embodiment of the present invention.

FIGS. 3A-3H shows bias conditions of flash memory cell arrays for a series of memory operations: erase, program, and read. Cells A, B, and C are connected to the bitlines BL_A, BL_B, and BL_C, respectively. The control gates of each cell in each string is connected to a pair of gates lines CG1/CG2. The drain-select transistor 322 in the Cell A connects the memory cell A to the bit line BL_A. The drain-select transistor 342 in the Cell B connects the memory cell B to the bit line BL_B. The drain-select transistor 362 in the Cell C connects the memory cell C to the bit line BL_C. The drain-select transistor in each memory cell is connected to a gate line SG1 and the source-select transistor in each cell is connected to gate line SG2. FIG. 3A shows the bias condition for an erasing operation of the Cells A, B, and C. The memory cells A, B, and C are erased by applying a high voltage (HV) of about 10 volts to the second control gate line CG2, before programming. The erased memory transistors can store data "1".

Figure 3B:
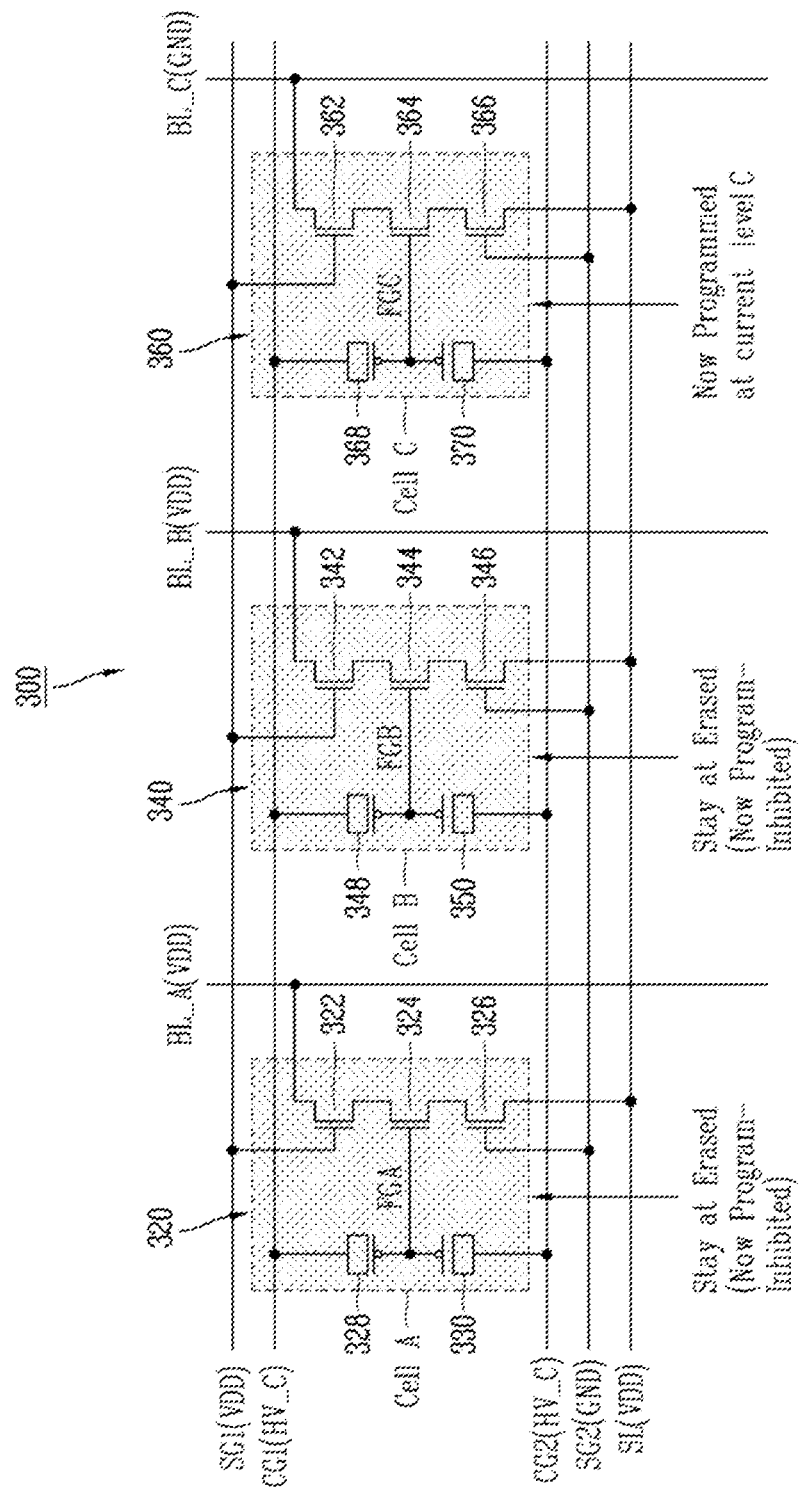

FIG. 3B shows the bias condition for programming the Cell C only in the array. The memory cell C is programmed toward the current level C flowing on a bit line BL_C by applying a high voltage (HV_C) to the control gate lines CG1 and CG2 and grounding the bitline BL_C. However, the programming of Cell C does not affect Cells A and B, and even if Cells A and B are altered in a certain degree, they are only changed within an allowable range predefined because their bitlines, BL_A and BL_B are biased by voltage potential VDD when receiving the voltage HV_C through the control gate lines CG1/CG2.

Figure 3D:
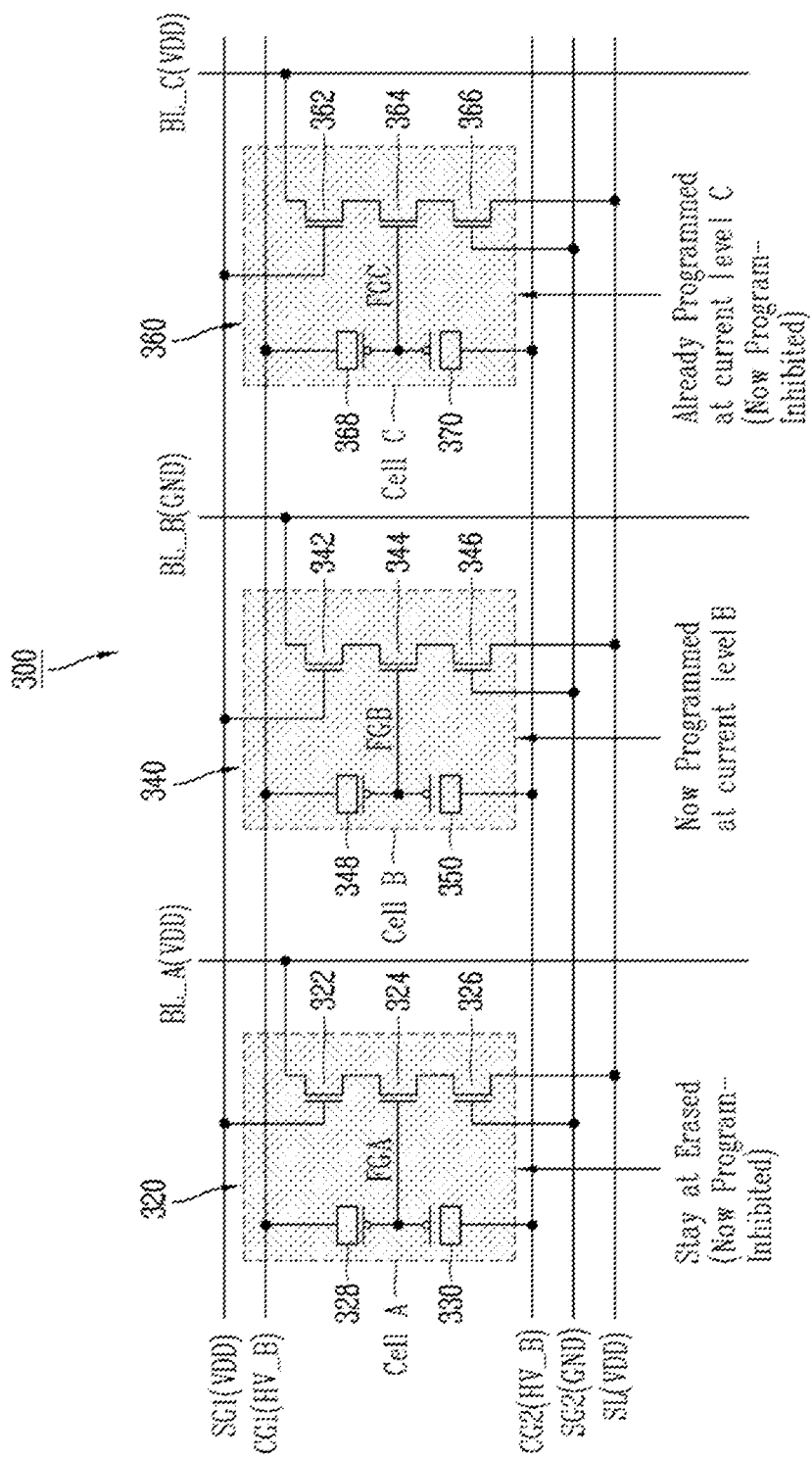
Figure 3E:
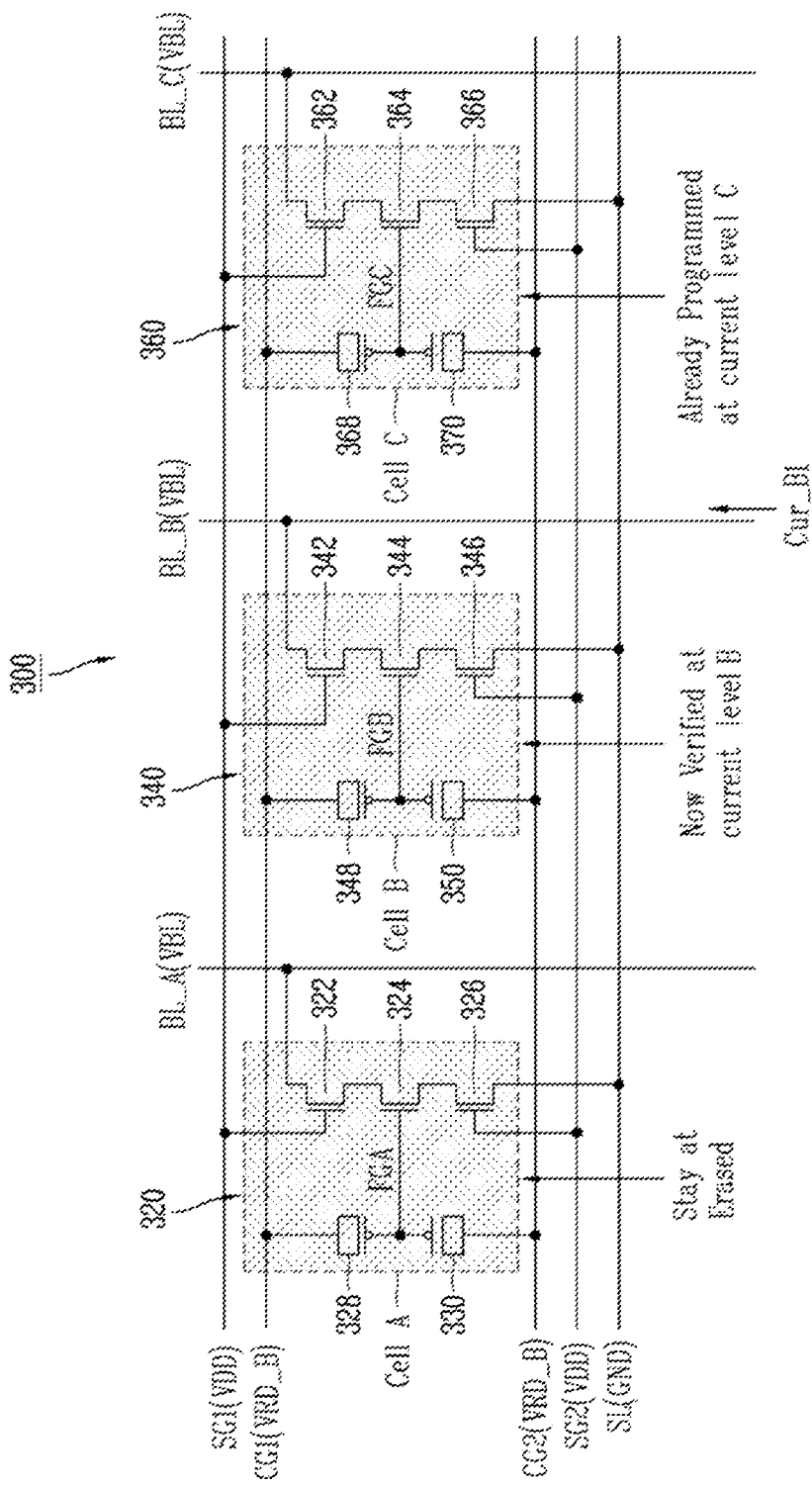
Figure 3F:
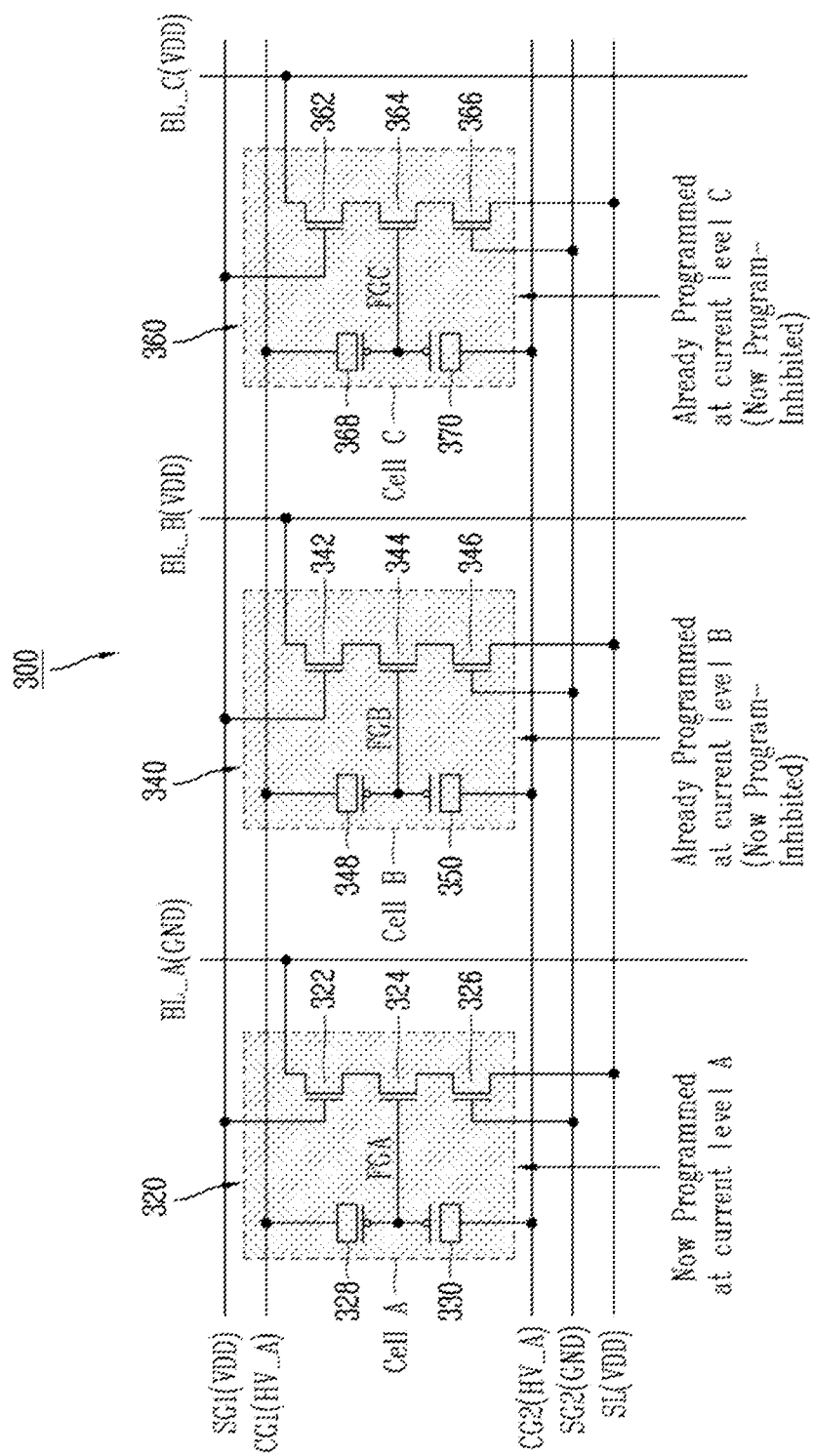
Figure 3G:
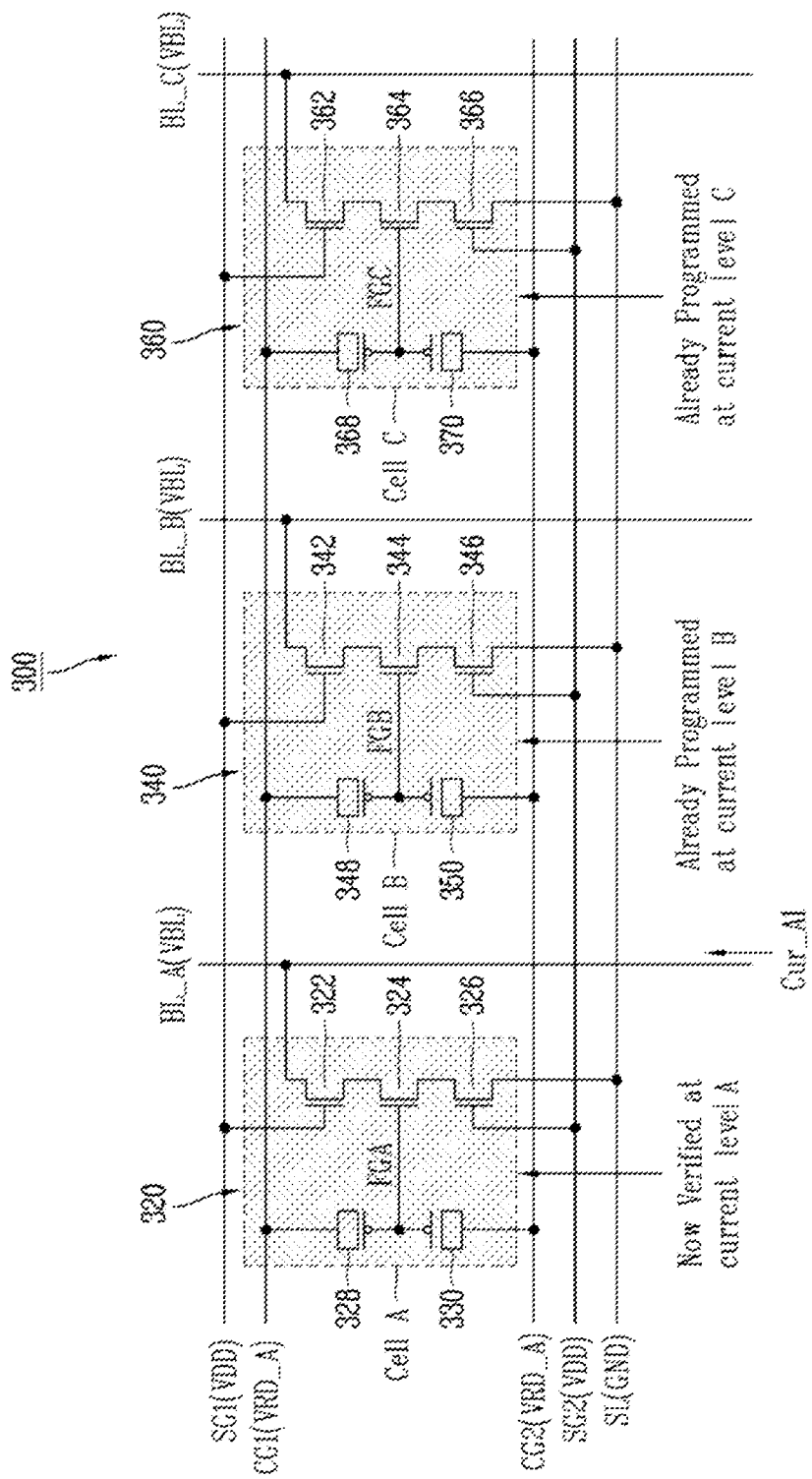
Figure 3H:
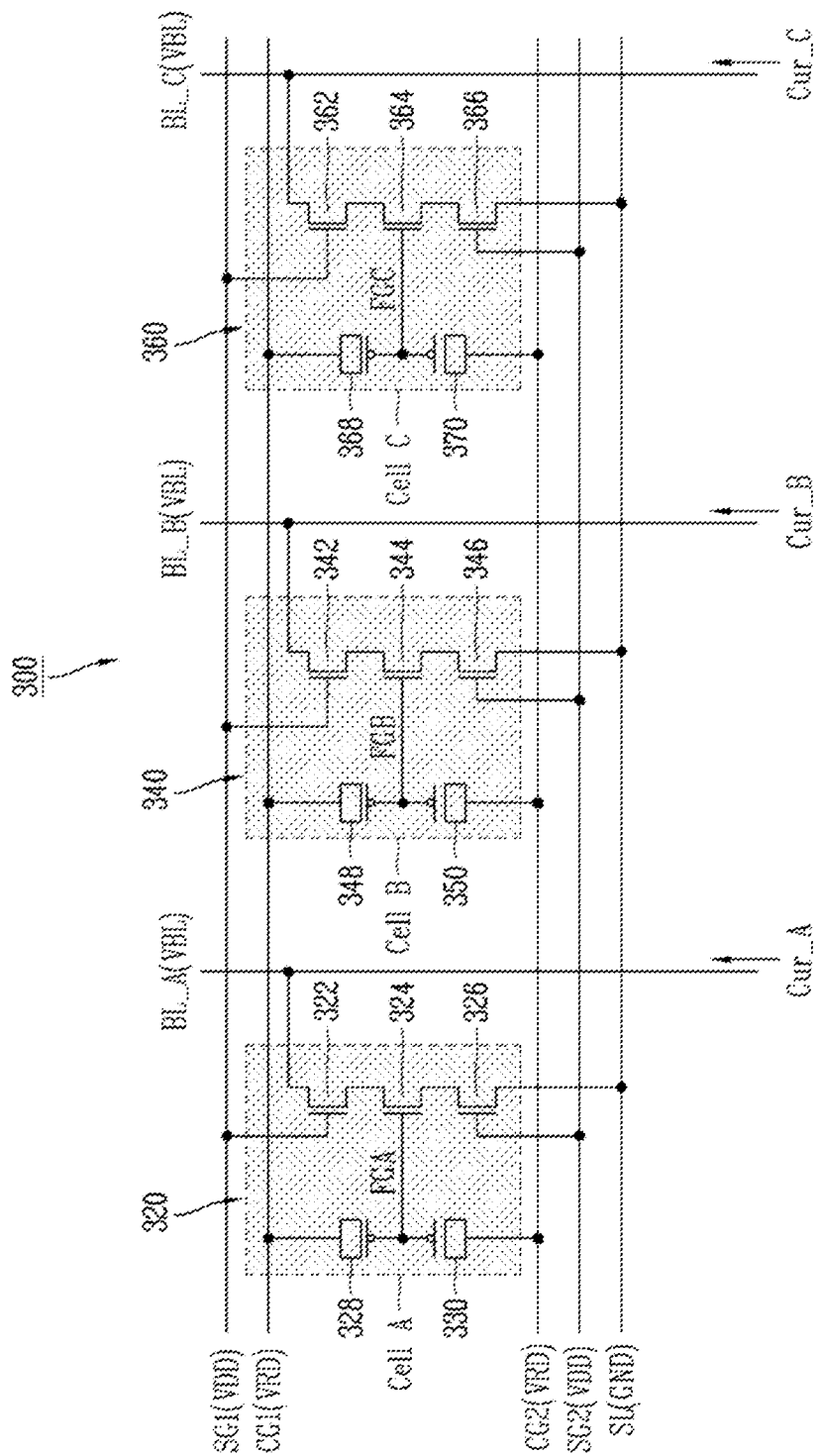
Figure 3C:
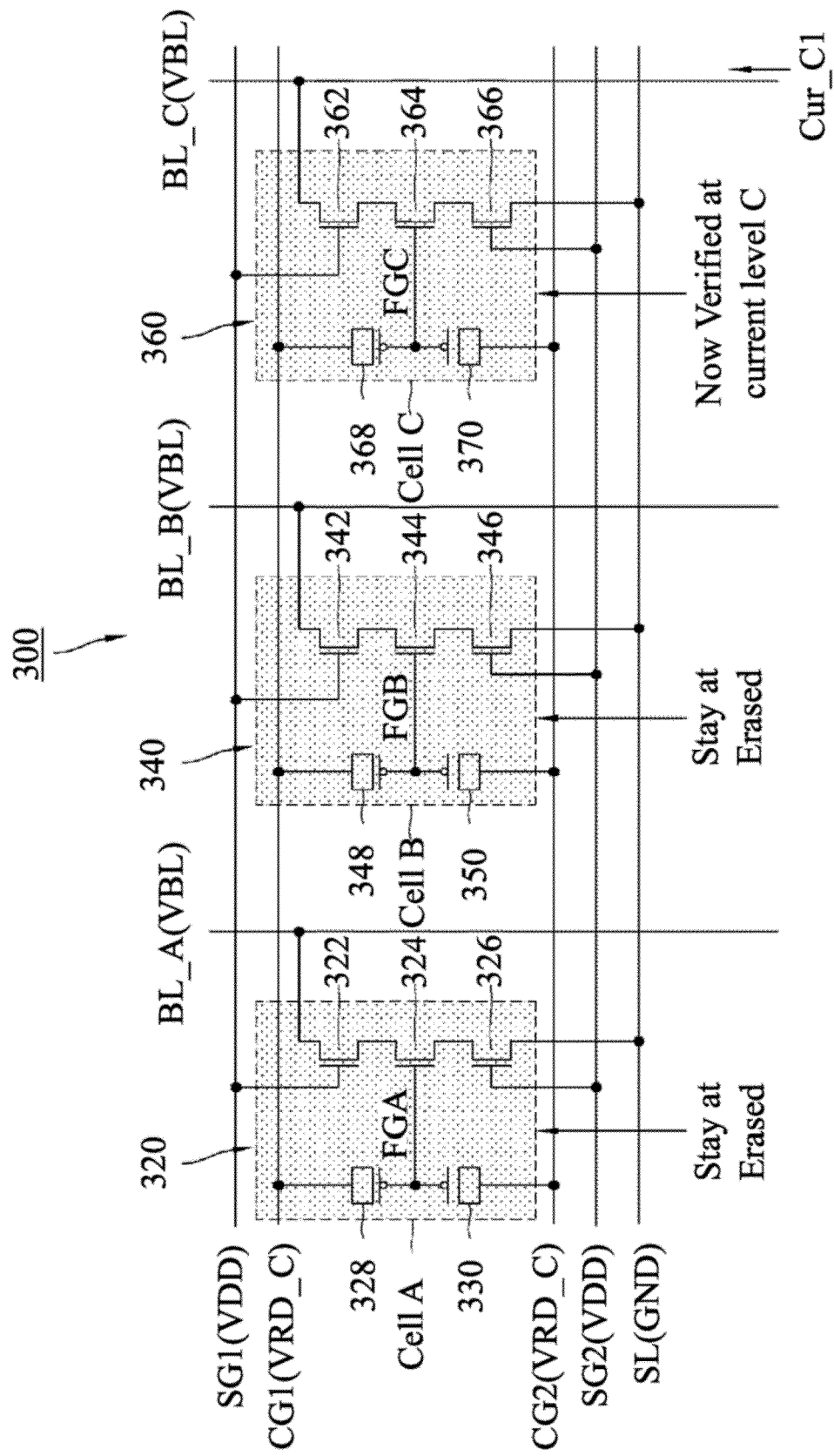
Figure 3D:
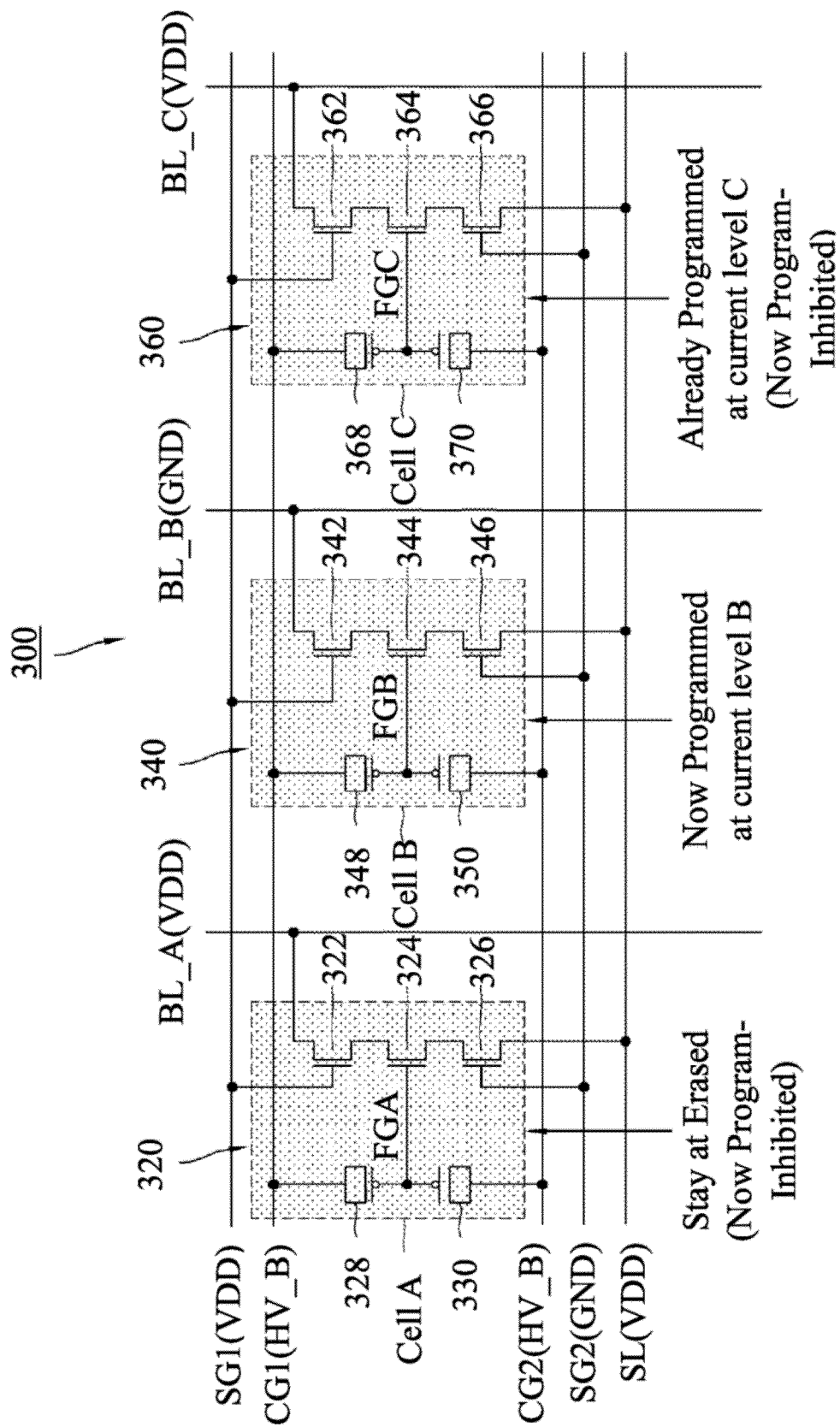
Figure 3E:
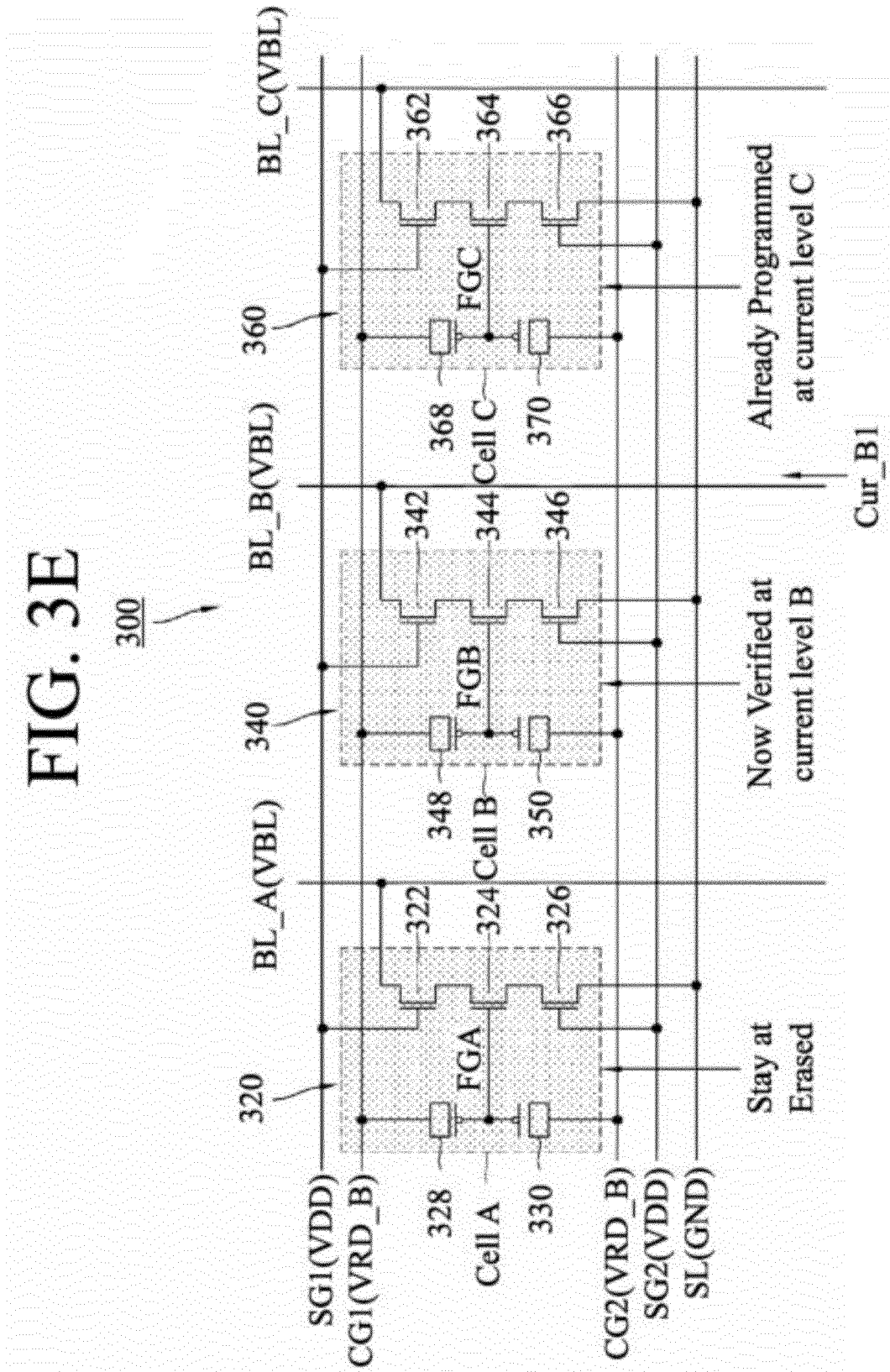
Figure 3F:
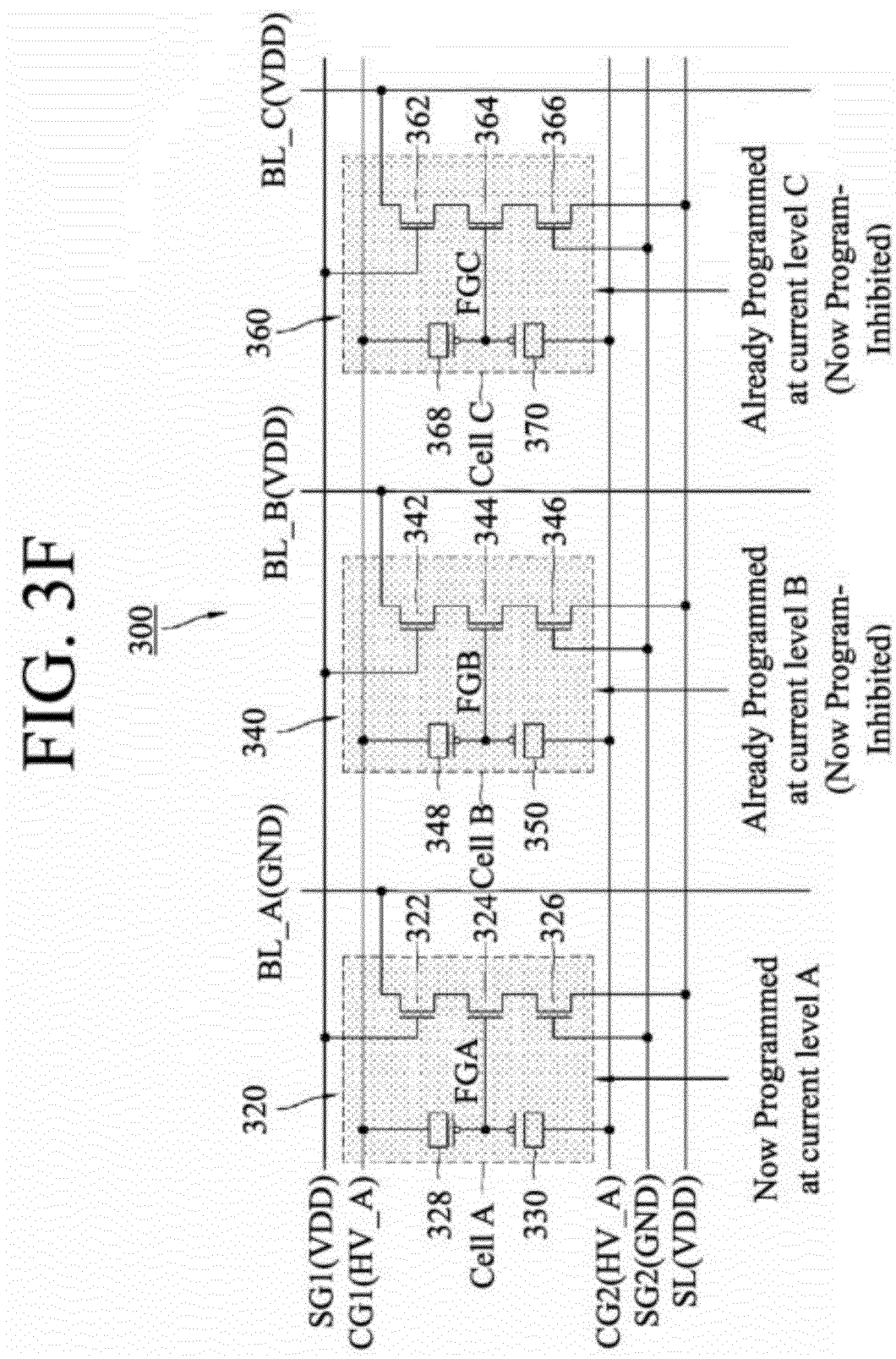
Figure 3G:
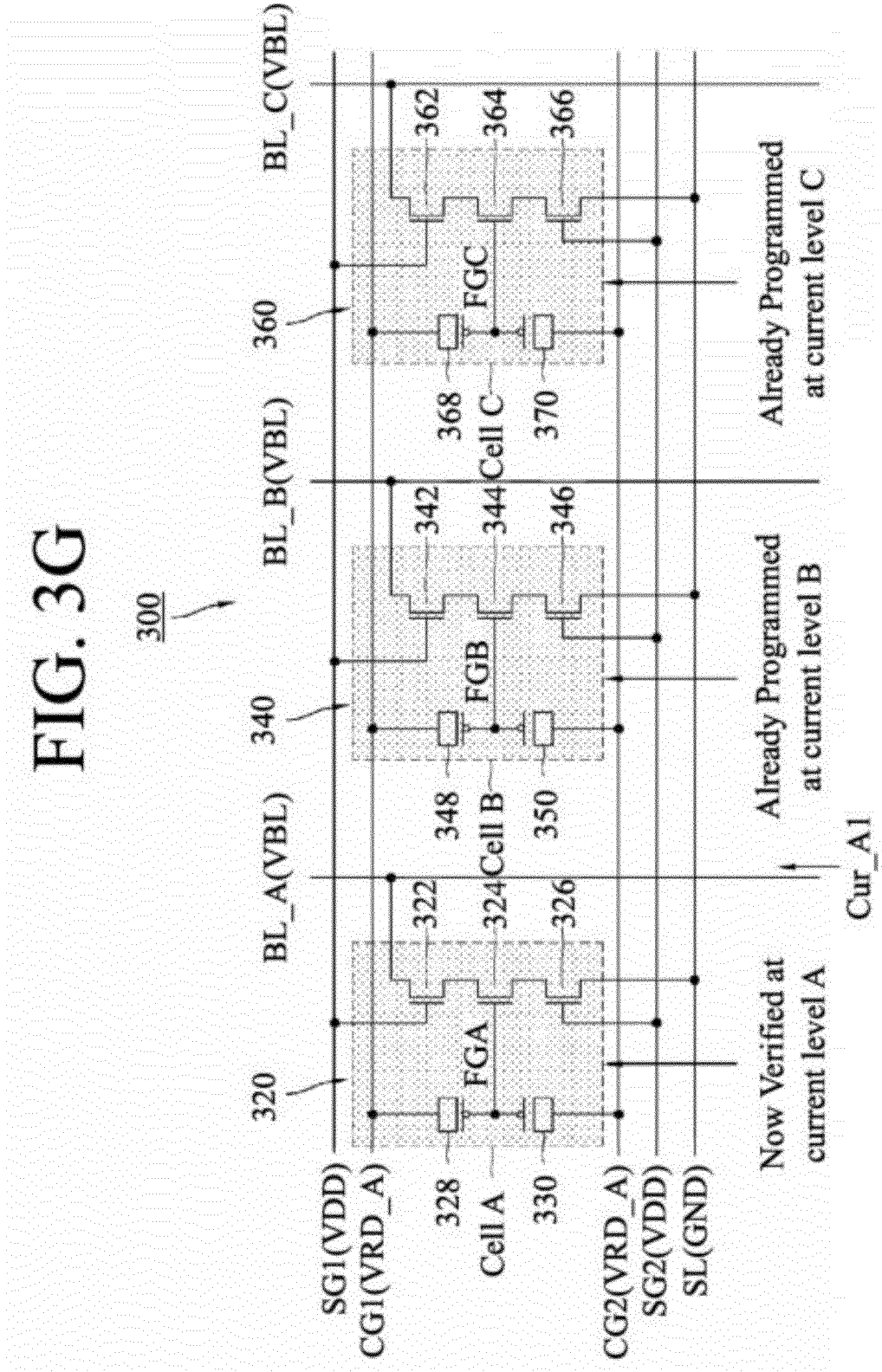
Figure 3H:
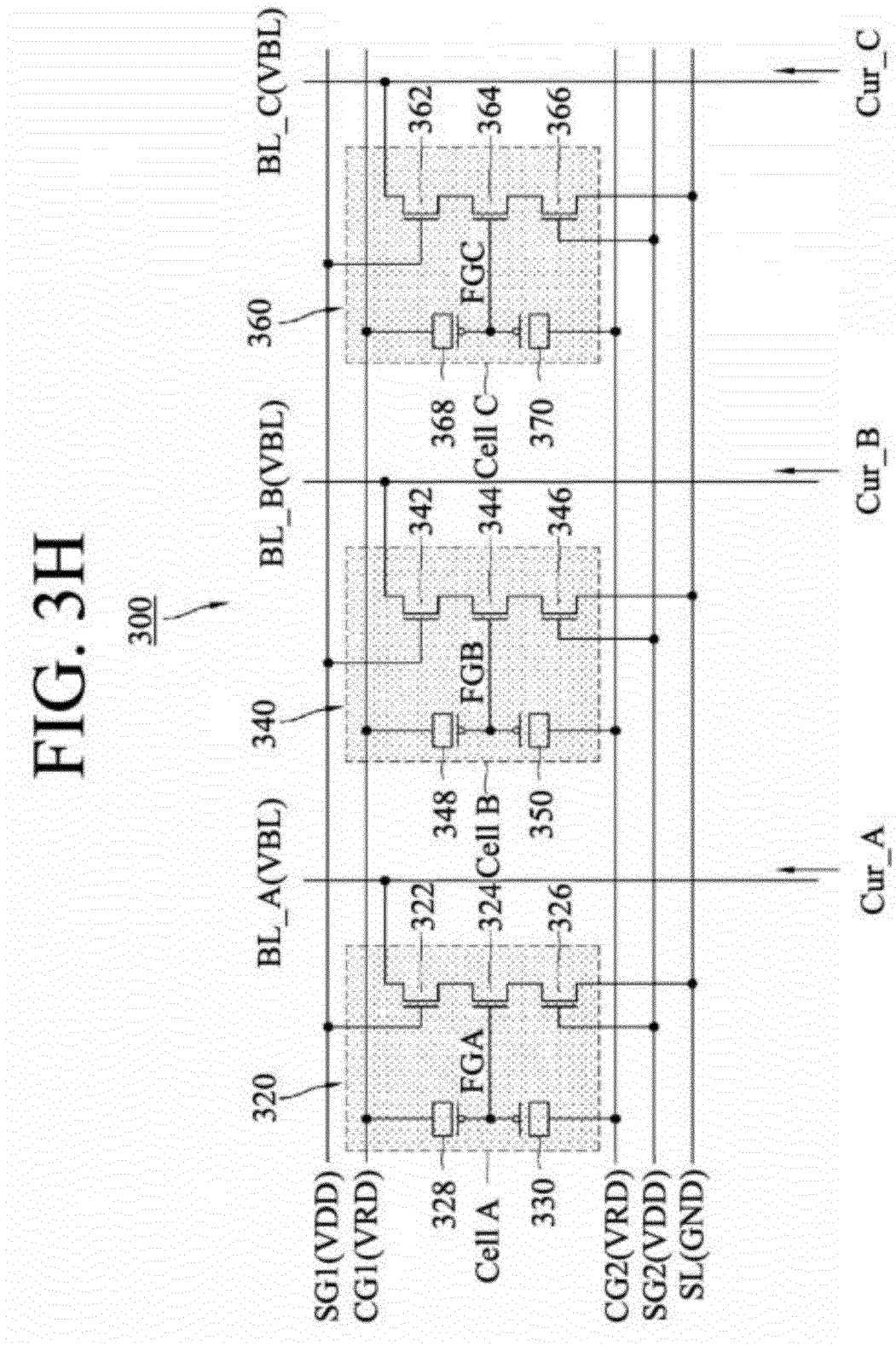

FIG. 3C shows the memory cells' biased condition for verifying Cell C that is programmed. Once the program operation to the memory cell C is executed, internal checks are performed to ensure whether Cell C is sufficiently programmed by sensing the current level, i.e., Cur_C1, in BL_C while the control gate lines CG1 and CG2 are biased at the read voltage of VRD_C. If the memory cell C does conduct the current larger than the targeting level in response to the gate voltage VRD_C, the state of the Cell C is not properly programmed. Otherwise, if Cell C conducts current with a targeting level or less than that level in response to the read voltage of VRD_C, the Cell C is properly programmed. This program-verify step, as shown in FIGS. 3B and 3C, is to be repeated until the Cell C can conduct current with a current level C during read operation. During this program-verification operation performed to the memory cell C, the memory cells A and B are to preserve or remain close to the erased condition by being inhibited from the programming.

FIG. 3D shows the bias condition of programming the Cell B after verifying the programmed memory cell C. Then, the programming of the memory cell B is performed by applying a high voltage (HV_B) to the linking lines CG1 and CG2 and grounding the bitline BL_B. However, programming the memory cells A and C are inhibited by biasing their respective bit lines to voltage potential VDD when receiving large positive voltages HV_C through the control gate lines CG1/CG2.

FIG. 3E shows the memory cells' biased condition for verifying memory cell B. Once the program operation to the memory cell B is executed, internal checks are performed to ensure whether the memory cell B is sufficiently programmed by sensing the current level, i.e., Cur_B1, in BL_B while the control gate lines CG1 and CG2 are biased at the read voltage of VRD_B. If the memory cell B does conduct the current larger than the targeting level in response to the gate voltage VRD_B, the state of the memory cell B is not properly programmed. Otherwise, if the memory cell B conducts current with a targeting level or less than that level in response to the read voltage of VRD_B, the memory cell B is properly programmed. This program-verify steps, as shown in FIGS. 3D and 3E, are to be repeated until the memory cell B can conduct current with a current level B during read operation. During the program-verification operations of the memory cell B, the memory cells A and C retain their conditions (not altered by the operation of the cell B), or even if the changes occur, they remain within an allowable range predefined (the erased status of the memory cell A, the programmed status for the memory cell C).

FIG. 3F shows the bias condition for programming a memory cell A after verifying the memory cell B. Like the other memory cells B and C, the programming of the memory cell A is performed by applying a high voltage (HV_A) to the control gate lines CG1 and CG2 and grounding the bitline BL_A. Meanwhile, programming the memory cells B and C are inhibited by biasing their respective bit lines to voltage potential VDD when receiving large positive voltages C through the control gate lines CG1/CG2.

FIG. 3G shows the memory cells' biased condition for verifying that memory cell A has been properly programmed. Once the programming of the memory cell A is executed, internal checks are performed to ensure whether the memory cell A is sufficiently programmed by sensing a current level Cur_A1 on the bit line BL_A while the control gate lines CG1 and CG2 are biased at the read voltage of VRD_A. If the memory cell A does conduct the current larger than the targeting level in response to the gate voltage VRD_A, the state of the memory cell A is not properly programmed. Otherwise, if the memory cell A conducts current with a targeting level or less than that level in response to the read voltage of VRD_A, the memory cell A is properly programmed. This program-verify steps, as shown in FIGS. 3F and 3G, are to be repeated until the memory cell A can conduct current with a current level A during read operation. During the program-verification operations performed to the memory cell A, the memory cells B and C retain their conditions (not altered by the operation of the cell A), or even if the changes occur, they remain within an allow able range predefined (the programmed status of the memory cells B and C), protected from any unwanted (programming) disturbance caused by the programming of the memory cell A.

FIG. 3H shows the biased state of the flash memory cells A, B, and C to perform read operations, respectively. After all the memory cells A, B and C are programmed, the stored cell values can be read by applying a read voltage (VRD) to the control gate signals CG1 and CG2. As previously described through FIGS. 3A-3G, the selected memory cell is programmed while the non-selected memory cell is not affected by the programming or, even if affected, the non-selected memory cell is affected within the allowable range by implementing the cells' program-inhibit bias condition. And the cell currents from Cells A, B, and C shall be close to their target current levels Cur_A, Cur_B, and Cur_C, respectively.

Figure 4:
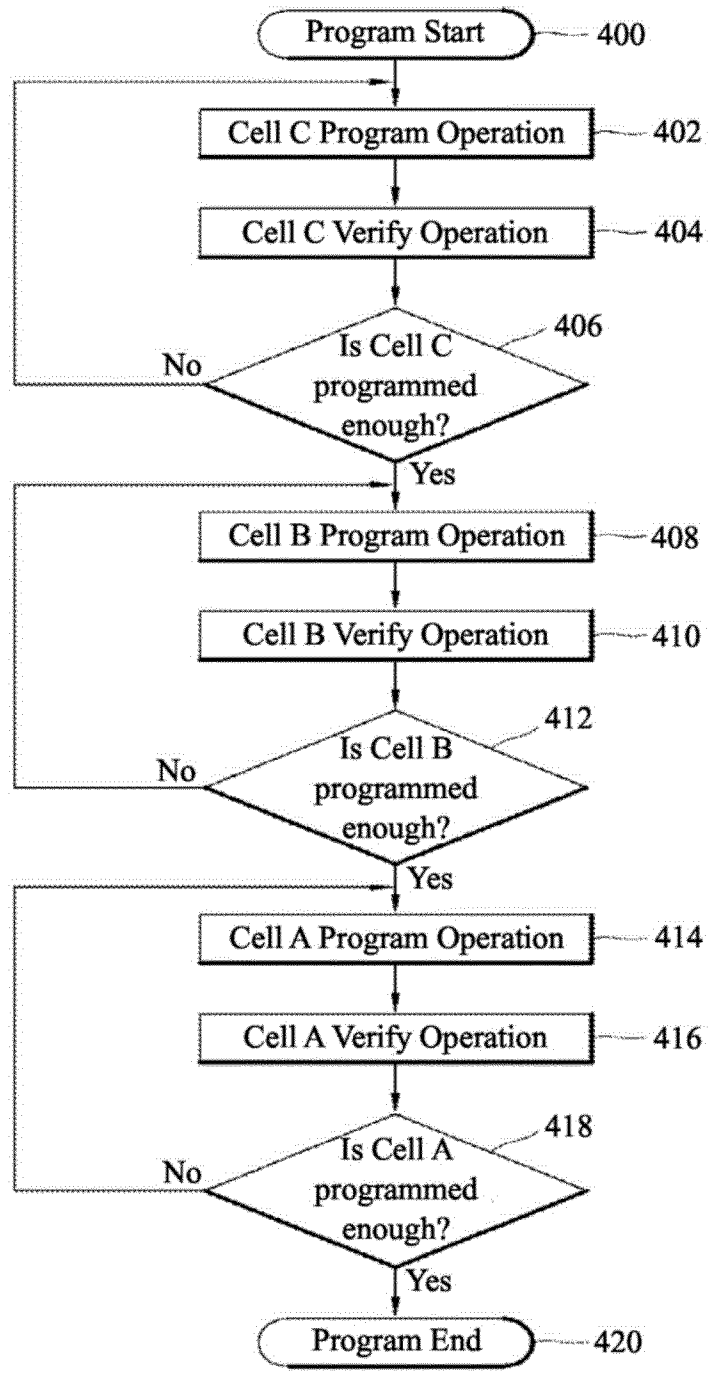
FIG. 4 is a flowchart depicting a method of programming memory cells shown in FIG. 3.
Figure 5:
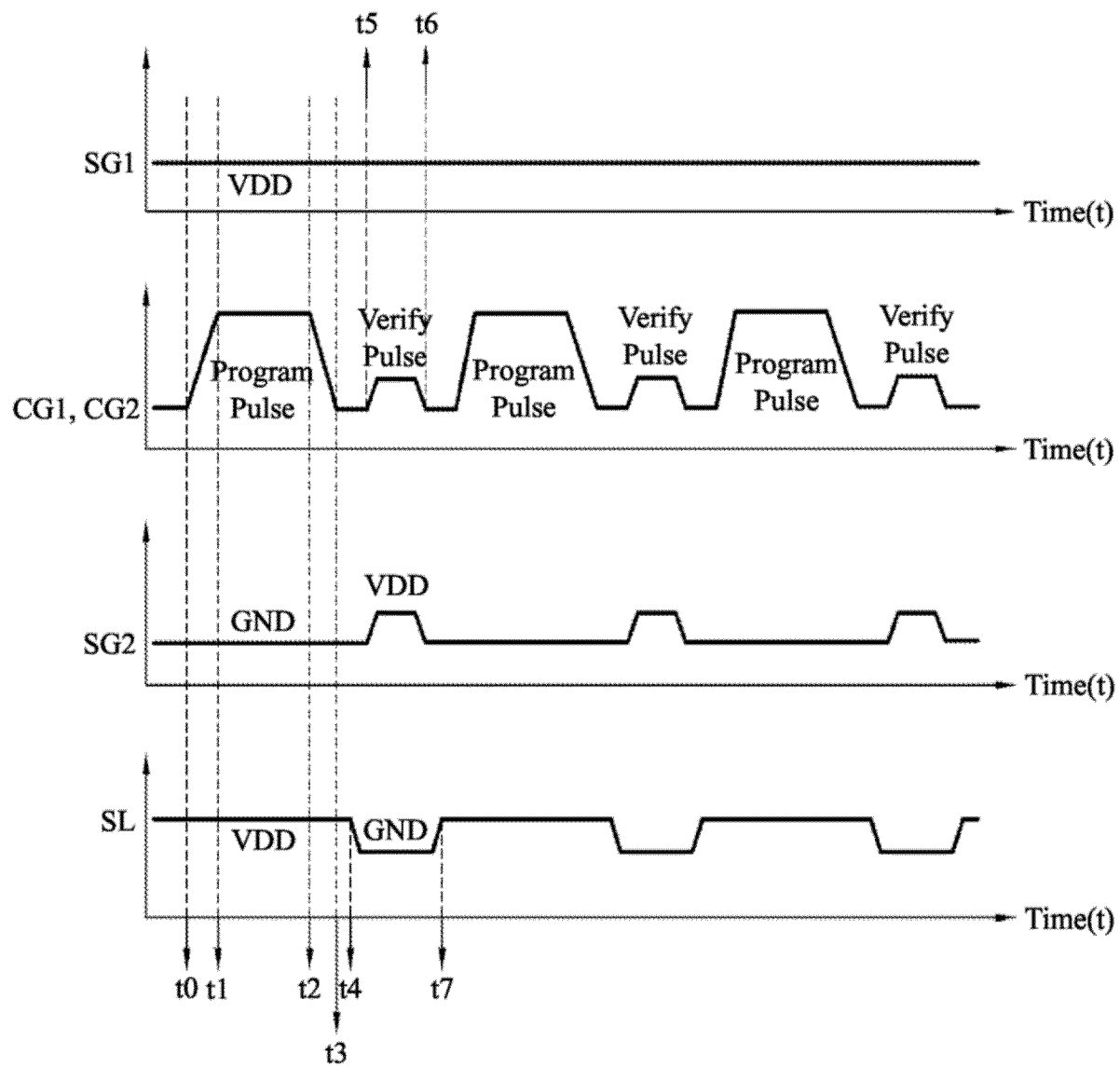
Figure 6:
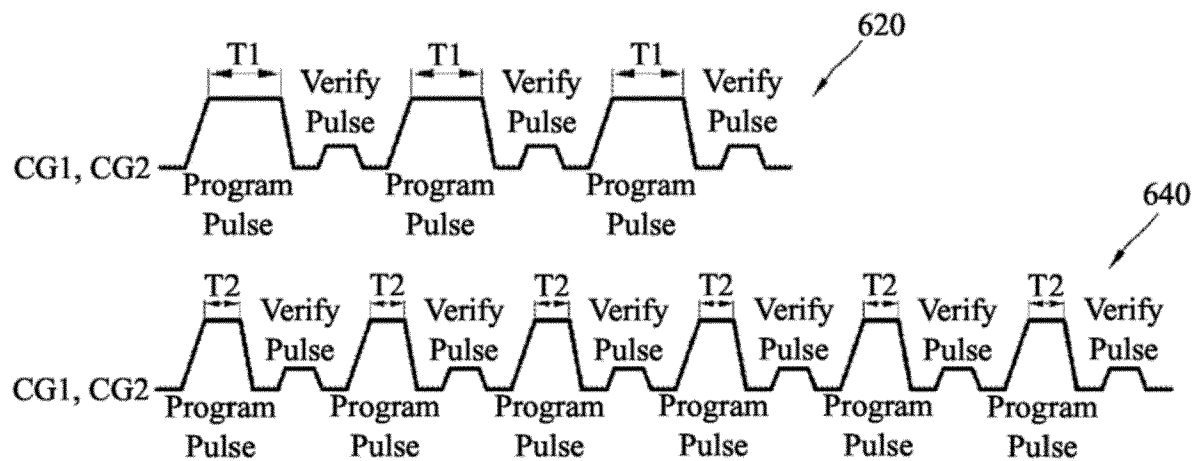
Figure 7:
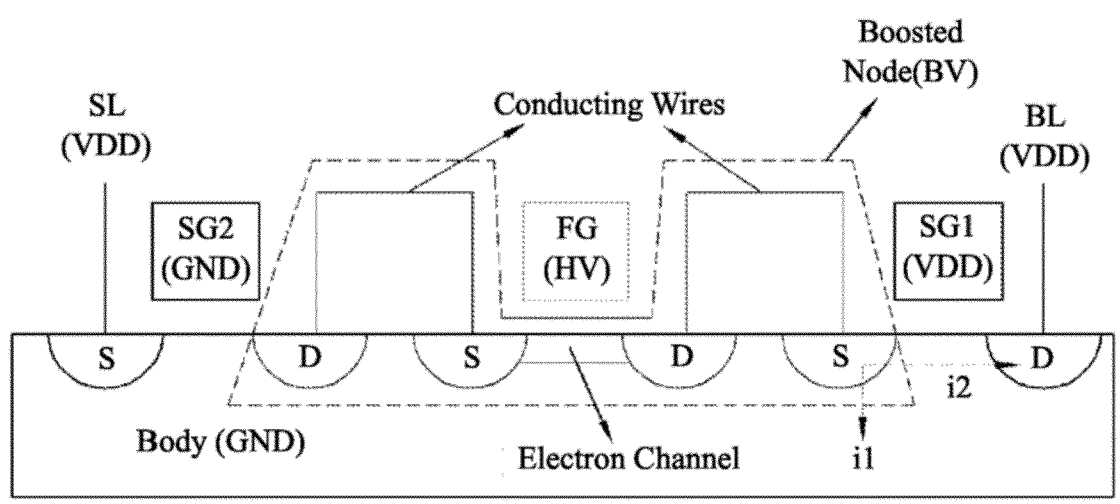
Figure 8A:
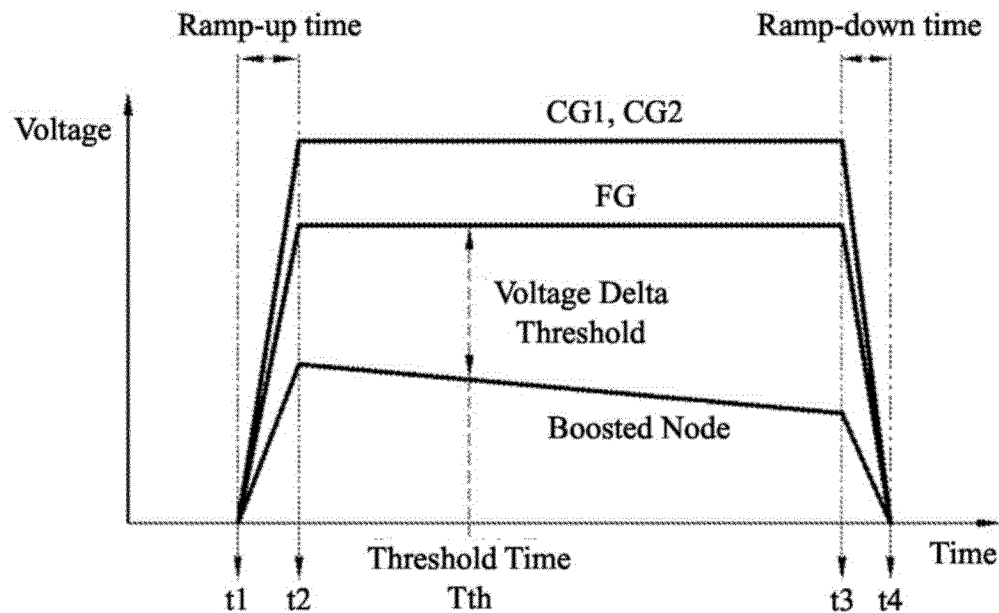
Figure 8B:
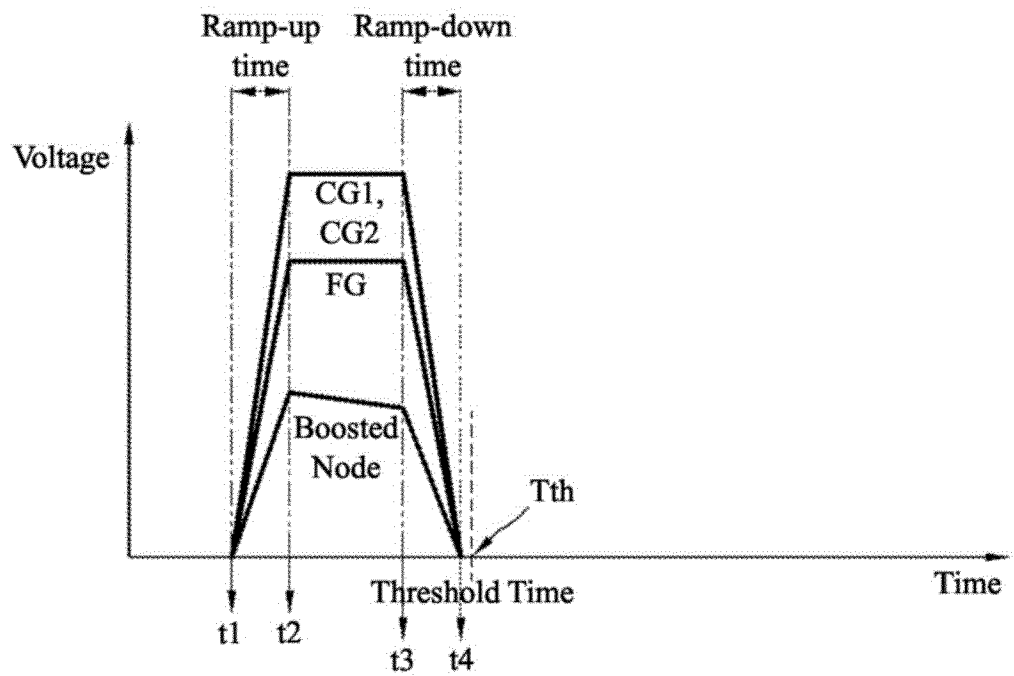
Figure 9:
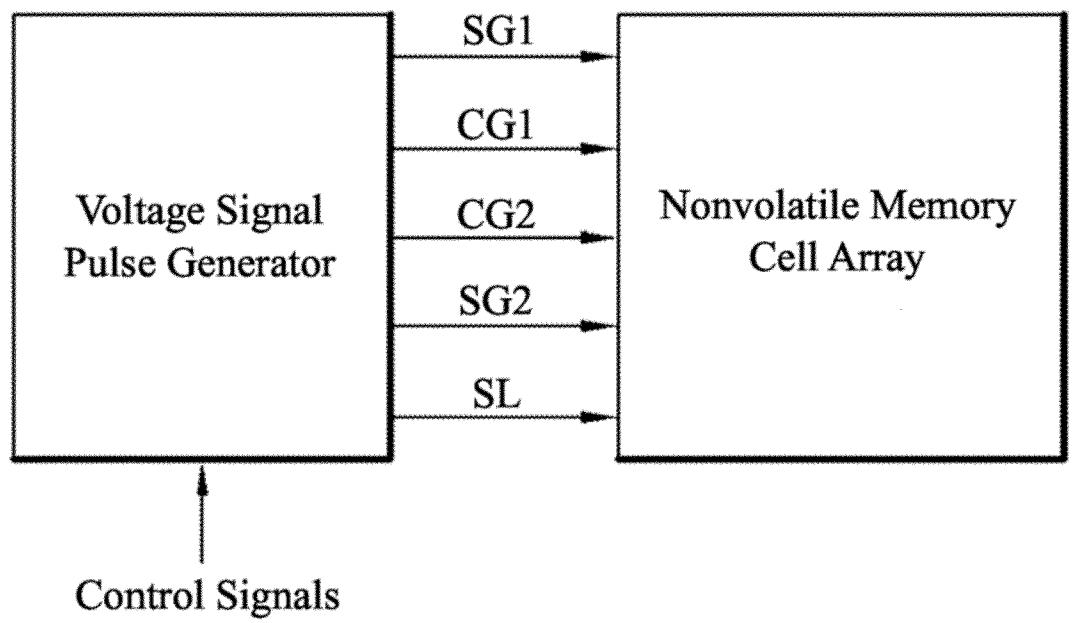
Figure 10:
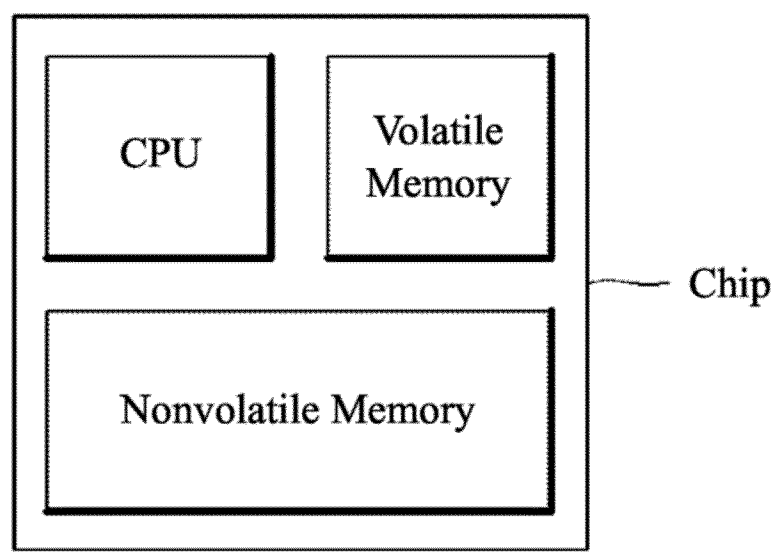

FIG. 4 is a flowchart depicting a method of programming non-volatile memory cells shown in FIG. 3. At step 400, the memory cells A, B and C to be programmed are erased. At step 402, programming of the memory cell C is implemented. The first program voltage is applied to the control gate lines CG1 and CG2 and its coupled bitline BL_C is grounded. At step 404, the memory cell C's state is verified. To determine whether the memory cell C was properly programmed, the memory cell C's content is read by applying a reference voltage of VRD_C to the control gate lines CG1 and CG2. At step 406, if the memory cell C conducts current at higher than a target level through the bitline BL_C, the memory cell C is not properly programmed at a target level. In that case, a program and verify operations of steps 402, 404 are to be repeated until determining that the memory cell C is properly programmed by sensing its conducting currents. If the memory cell C conducts current lower than or at the target level, Cur_C1 and the memory cell C is verified as properly programmed.

At step 408, after finding that the memory cell C is properly programmed, programming of the memory cell B is implemented by biasing its bitline BL_B to an approximately ground level. But also, the bitlines BL_A and BL_C are biased by voltage potential VDD to protect the other memory cells A and C from any unwanted programming caused by the programming of the memory cell B. At step 410, the state of the memory cell B is verified. Like memory cell C, to determine the state of memory cell B (whether it was programmed or erased), the memory cell B's content is read by applying a reference voltage of approximately VRD_B connected to the gate lines of the memory cell B.

At step 412, if the memory cell B conducts current at higher than a target level through the bitline BL_B, the memory cell B is not properly programmed. In that case, a program and very operations of steps 408, 410 are to be repeated until determining that the memory cell B is properly programmed by sensing its conducting currents. If the memory cell B conducts current lower than or at the target level, Cur_B1, the memory cell B is verified as properly programmed.

At step 414, after finding a properly programmed memory cell B, the programming of the memory cell A is then implemented by biasing its bitline BL_A to an approximately ground level while biasing the other memory cells B and C to the voltage supply level VDD. Thus, the electrons stored in the memory cells B and C are limitedly affected by the programming of memory cell A. At step 416, the state of the memory cell A is verified. To determine whether memory cell A was properly programmed, the memory cell A's content is read by applying a reference voltage of approximately VRD_A connected to the gate lines of the memory cell A.

At step 418, if the memory cell A conducts current at or higher than a target level through the bitline BL_A, the memory cell A is not properly programmed. In that case, a program and verify operations of steps 414, 416 are to be repeated until determining that the memory cell A is properly programmed by sensing its conducting currents. If the memory cell A conducts a current lower than the target level, Cur_A1, the memory cell A is verified as properly programmed.

At step 420, once determining the all selected memory cells A, B and C are properly programmed, the program operation of the row memory array of logic compatible flash memory is terminated. Since the target program level is differently set for each cell, each cell shall be selectively programmed and verified while the program-inhibited cells are largely protected from unwanted programming by the aforementioned self-boosting technique.

Figure 5:
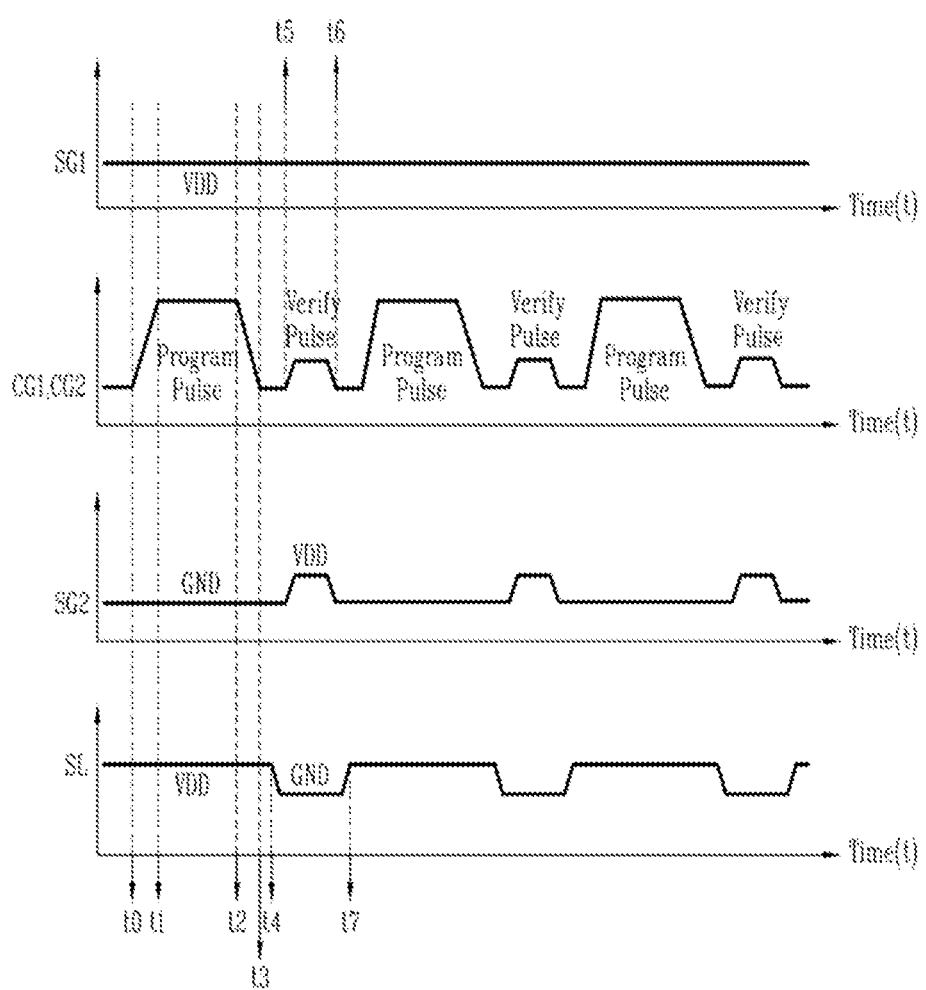
FIG. 5 is a timing diagram describing various voltage signals for programming selected row memory cells.

FIG. 5 is a timing diagram describing various voltage signals for programming selected row memory cells. The programming method can selectively program the cell in the row memory array by the self-boosting method shown in FIGS. 2 and 3. The sequential voltages on control gates lines CG1/CG2 include programming voltage pulses and verifying voltage pulses. The phase of the program pulse consists of times for voltage ramp-up, program, and voltage ramp-down. Likewise, the phase of the verify pulse consists of times for a voltage ramp-up, verifying, and a voltage ramp-down. Due to the significant parasitic capacitance of the long wire carrying the control signal in the memory array, these ramp-up and ramp-down times can be a significant portion of the overall program time.

The sequence of combinations of the input voltage signal to program the three memory cells A, B and C in FIG. 3 over a certain period of time is as follows: At time t0, a supply signal at VDD voltage is applied to the select gate line SG1 and the source line SL, a control gate lines CG1/CG2 are grounded, the select gate line SG2 has a ground voltage. At time t1, the control gate lines CG1/CG2 are raised to a target program level, after they are ramped up from time t0. At time t2, the control gate lines CG1/CG2 start to decrease and are returned to the ground level at time t3, after they are ramped down. At time t4, the VDD supply voltage on the source line SL begins to decrease until it gets to zero volts. At time t5, a verify pulse is applied to the control gates lines CG1/CG2 until it reaches a target level. At time t6, this verify pulse is decreased to the ground level. At time t7, the voltage supply will be applied to the source line SL unit such that it returns to the VDD voltage. Once the programming of the first memory cell C is completed, the next cycle of program/verify pulses resumes for the next memory cells, i.e., the cells B and A after a time interval specified.

Figure 6:
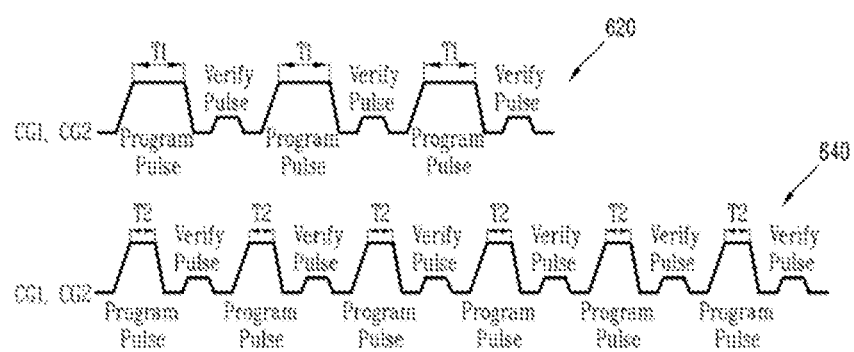
FIG. 6 illustrates two exemplary pulses applied to the control gate lines CG1, CG2 of a memory cell array in FIG. 2 during memory cell programming and verifying iterations.

FIG. 6 illustrates two exemplary pulses applied to the control gate lines CG1, CG2 of a memory cell array in FIG. 3 during memory cell programming and verifying iterations. In FIG. 6, both upper and lower diagramming show an exemplary series of program pluses for trapping a sufficient amount of the electrons on the floating gate of the memory cell A, B, and C in FIG. 3. Also, as discussed in FIG. 5, after applying each program pulse having a pulse high width T1 or T2, a verify pulse is subsequently applied to the control gate lines CG1, CG2 after some delay.

The upper diagram shows a series of three program/verify pulse cycles. The total accumulated program pulse high time is calculated as a product of each program pulse high duration of T1 and the number of the iterations, which is 3. In contrast, the lower diagram shows a series of six program/verify pulse cycles, each program pulse high duration of T2. Thus, the total accumulated program pulse high time is calculated as a product of each program pulse high duration of T2 and the number of iterations, which is 6. As a result, an accumulated program pulse high time for both cases (i.e., T1*3 and T2*6) may be similar provided that the duration of T1 is equivalent to about two times the duration of T2. Therefore, the programming of the memory cell can be completed once the third and the six iterations of the program-verify pulses are applied. On the other hand, the program pulse with T1 or T2 each requires the time for ramp-up before the program and ramp-down after the program. For the program pulse with T1 to program the memory cells, the time for three cycles of ramp-up and ramp-down is expected to occur. On the other hand, for the program pulse with T2 to program the same memory cells, the time for six cycles of the ramp-up and ramp-down is expected to occur.

Provided that the cycle of the ramp-up and ramp-down takes the same time regardless of a program pulse high width, program/verify iterations with a longer pulse high width (i.e., T1) requiring fewer cycles of ramp-up and ramp-down and verify pulses takes significantly reduced overall program/verify time compared to the program/verify iterations with a shorter pulse high width (i.e., T2). In other words, the total program time is much shorter with the case of the longer program pulse with T1, since it amortizes the timing overhead of the pulse ramp-up and ramp-down, the verify pulse time, and the associated delay between the pulses.

Figure 7:
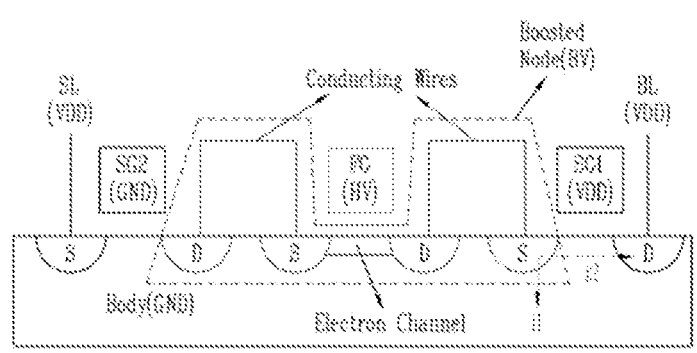
FIG. 7 shows a cross-section of a series of transistors of the logic compatible flash memory cell formed on a P-doped body with the program-inhibition bias condition according to an embodiment of the present invention.

FIG. 7 shows a cross-section of a series of transistors of the logic compatible flash memory cell formed on a P-doped body with an illustration of the program-inhibition bias condition. In FIG. 7, "program-inhibited via self-boosting" memory cell B in FIG. 2B is formed on the P-doped substrate. As previously mentioned, to turn off the drain-select transistor, both the transistor's n+ drain region (connected to the bitline BL) and the transistor's gate (connected to select gate line SG1) are biased to VDD. Also, to turn off the source-select transistor, the transistor's n+ source region (connected to the source line SL) is provided with the power supply voltage VDD, and the transistor's gate (connected to select gate line SG2) is grounded.

The Boosted Node driven to the boosted voltage (BV) in a dashed line includes two "Conducting Wires" mounted on the p-substrate. The first of the conducting wires are positioned between the drain-select transistor (with SG1 select gate line) and the read transistor, and the second of the conducting wires is positioned between the source-select transistor (with SG2 select gate line) and the read transistor. As earlier discussed, the floating gate FG of the read transistor is electrically coupled to the control gate lines CG1, CG2 carrying a program voltage that is shared by other memory cells in the flash array, and the floating gate FG is coupled to the certain high voltage (HV).

When both the drain-select transistor and the source-select transistor are turned off, the region defined as a Boosted Node BV becomes electrically floating. The Boosted Node BV is capacitively coupled to the floating gate FG as well as the P-doped body substrate. Thus, the boosted node will be self-boosted to the certain voltage level when a high voltage is applied to the floating gate. Ideally, the voltage difference between the floating gate FG and Electron Channel can be sufficiently small enough to inhibit electron tunneling from the Electron Channel to the floating gate FG even if a program voltage is applied to the adjacent memory cell in the selected row memory array.

The boosted node voltage at a given time can be determined by this equation approximately: Boosted node voltage (time)=(approximately) $Cap\_A/(Cap\_A+Cap\_B) \times FG\text{-}voltage - (i1+i2)*time/(Cap\_A+Cap\_B)$, wherein Cap_A denotes capacitance between FG and the boosted node, Cap_B denotes capacitance between the boosted node and the body (GND), i1 is a junction leakage current from the source and drain n+ regions to the body, and i2 is a subthreshold leakage current from the boosted node to the BL through the select transistor of which the gate is connected to SG1. That is, "i1" in a dashed arrow denotes the junction leakage current to the body and "i2" in a dashed arrow denotes the subthreshold leakage current through the drain-select transistor.

Given that Cap_A can have similar value to Cap_B, the boosted node has a self-boosted voltage raised to approximately 50% of the memory cell B's floating gate FG (=HV) immediately after when the program pulse is ramped up to the high value specified. While the program pulse is maintained high, however, the junction leakage current to the body and subthreshold leakage current through the drain-select transistor can discharge the boosted node voltage. As a result, the voltage difference between the floating gate and the electron channel of the read transistor becomes high enough after a certain time, allowing the Fowler-Nordheim tunneling from the electron channel to the floating gate EG, which is not intended for the program-inhibited cell. When the tunneling occurs, the unwanted programming of the memory cell B in FIG. 2 can occur, disturbing its original state.

FIG. 8 illustrates changes in (1) control gate voltage pulses on lines CG1 and CG2 and (2) a resulting boosted node voltage as a result of the leakage currents of the unselected memory cell described in FIG. 7 when the selected memory cell of the array is programmed with the same control gate pulses in FIGS. 2 and 3. The voltage pulses illustrated consist of at least three phases: a voltage ramp-up phase, a programming phase, and a voltage ramp-down phase.

Between time t1 and time t2 (ramp-up time), voltage signals to the control gate lines CG1 and CG2 are increased from 0V to the target program voltage level, and the floating gate FG voltage is increased to a certain voltage level by the coupling from CG1 and CG2. Then the boosted node voltage is increased to another certain voltage level by the coupling from the FG node, since the boosted node of the unselected memory cell enters an electrically isolated state, "floating state", as described in FIG. 2(b). At time t2, the programming phase starts. After that, the control gate lines CG1/CG2 maintain at the high program voltage, and the FG is also maintained at about high voltage level. The target program voltage level of CG1 and CG2 that pull up the FG node by coupling needs to be low enough (i.e., approximately less than 12V) such that the voltage difference between the FG and the boosted node is less than the voltage delta threshold (i.e., approximately 6V). As a result, the voltage difference between the FG node and the boosted node becomes small enough to prevent the unwanted electron tunneling of the unselected memory cell at the beginning of the program phase for the program-inhibited cell.

Due to the unwanted leakage current, however, the boosted node voltage can gradually decrease after reaching its peak value at time t2. At time t3, the ramp-down phase begins and the control gates CG1/CG2 starts to be discharged until it gets to nearly 0V at time t4. Also, at time t3, a self-boosted voltage applied to the Boosted Node begins to ramp-down and is lowered to about 0V at time t4. Between time t2 and time Tth, the magnitude of the voltage difference (voltage delta) between the floating gate FG and Boosted Node is sufficiently low enough to inhibit unwanted programming of the unselected memory cell, while the selected cell in the selected row memory array is programmed by Fowler-Nordheim tunneling of electrons when the shared control gate lines CG1 and CG2 are driven to high voltage program voltage level.

Figure 8A:
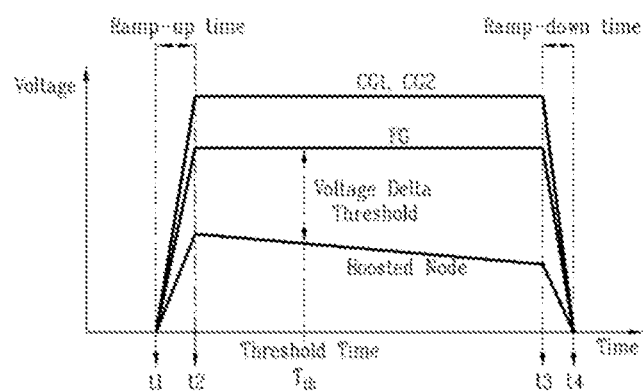
FIGS. 8A and 8B illustrate exemplary voltage pulses applied to FG and the boosted node of the unselected memory cell in accordance with one embodiment.

FIG. 8A shows that a program pulse high width (t3–t2) is longer than a critical time (Tth–t2) so that the voltage difference between FG and the boosted node becomes more than the voltage delta threshold after the threshold time Tth during the program operation. Time Tth is "threshold time" when the voltage in Boosted Node is lowered to reach a threshold level, which is the lowest voltage for the boosted node to prevent the tunneling of electrons into the floating gate FG. After passing time Tth, the self-boosting effect may become ineffective, and unwanted programming of the unselected memory cell can occur after time Tth. "Voltage Delta Threshold" denotes the maximum magnitude of the voltage difference between the floating FG and the Boosted Node to inhibit the electron tunneling between them.

Figure 8B:
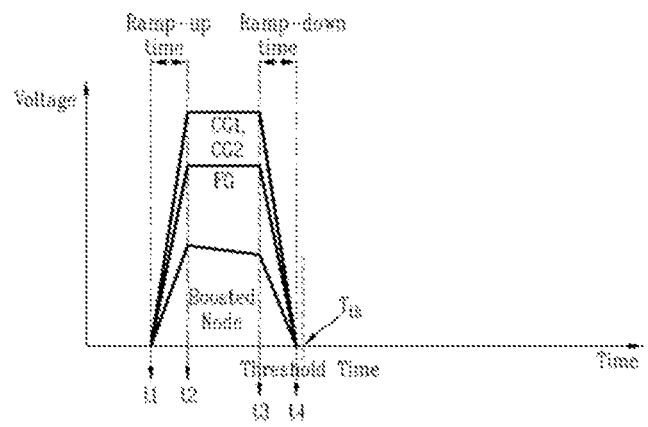

According to one embodiment of the present invention, FIG. 8B shows that a program pulse high width (t3–t2) is shorter than a critical time (Tth–t2) so that the voltage difference between FG and the boosted node continuously becomes less than the voltage delta threshold during the entire program operation. It needs to be noted that FIG. 8A shows the case where the voltage levels on the unselected memory cell (i.e., control lines CG1 and CG2 coupled to the unselected memory cell) start to ramp down at t3 after the threshold time Tth. In contrast, FIG. 8B shows the case where the voltage levels on the unselected memory cell start to ramp down at t3 before the threshold time Tth that is established.

On the other hand, the signal ramp-up and ramp-down time can be significant when the program pulse high width (t3–t2) becomes shorter. Since the selected cell (i.e., Cell A in FIG. 2) is not programmed during this overhead time (i.e., ramp-up and ramp-down time), the portion of this overhead time is preferred to be minimized. Therefore, the program pulse high width shall be maximized to minimize the portion of those ramp-up and ramp-down time overhead as long as the program inhibited cell does not reach the threshold time. Thus, according to the present invention, the control gate signal pulse of control gate lines CG1 and CG2 to the logic compatible Flash memory shall be maintained to be short enough (ex. less than 10 microseconds) so as not to reach the moment (i.e., threshold time) that the unwanted program operation can severely happen, while the pulse high width is maintained as large as possible so that the ramp-up and ramp-down time overhead can be effectively amortized.

Figure 9:
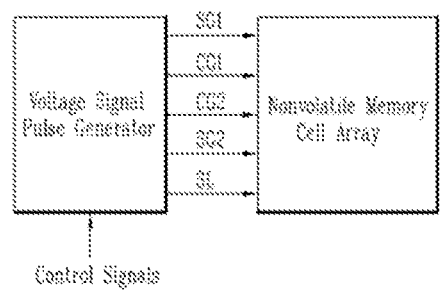
FIG. 9 illustrates a block diagram having the voltage signal pulse generator and the nonvolatile memory cell array according to an embodiment of the present invention.

FIG. 9 shows a block diagram having a voltage signal pulse generator and a nonvolatile memory cell array according to the present invention. With reference to the flash memory array in FIGS. 2 and 3, when receiving input signals (Control Signals), the voltage signal pulse generator operates the nonvolatile memory cell array by sending a set of control signals via control gate lines CG1/CG2, the select gate lines SG1/SG2, and the source line SL. In one embodiment of the present invention, the voltage signal generator produces a target program voltage of CG1 and CG2 that pull up a FG node of the nonvolatile memory cell by coupling, wherein the target program voltage level is sufficiently low (i.e., approximately less than 12V) that the magnitude of the voltage difference between the FG node and the boosted node of an unselected memory cell in the array is less than the voltage delta threshold (i.e., approximately 6V) while programming the selected memory cell in the array. As a result, the voltage difference between the FG node and the boosted node becomes small enough to prevent the unwanted electron tunneling of the unselected memory cell for the program-inhibited cell. Further, the voltage signal pulse generator also makes the control gate signal pulse of CG1 and CG2 short enough not to reach the moment (i.e., threshold time) that the unwanted program operation can severely happen, while the pulse high width is generated to be as large as possible so that the ramp-up and ramp-down time overhead can be effectively amortized.

In one embodiment, even if not specifically described in FIG. 9, the voltage signal pulse generator may include key subblocks such as a code memory, a timer, a one-time-programmable or read-only memory, or a controller circuit. The code memory is configured to store the operation sequence of the nonvolatile memory cell array (ex. the operation sequence shown in FIG. 4). The timer circuit can check the operation timing and modulate key signal pulses according to the specified timing (ex. timing of the program operation shown in FIG. 5). The One-Time-Programmable (OTP) or read-only memory can store the configurations to choose the appropriate voltage levels of the aforementioned control gate signal (ex. HV, HV_A, HV_B, HV_C, VRD, VRD_A, VRD_B, VRD_C, etc.) and timing information. (ex. t0~t7 in FIG. 5, t1~t4 in FIG. 8, etc.)

The information stored in the OTP memory cell can be predetermined or calibrated in each chip for fine-tuning after fabrication, whereas the information stored in read-only memory is predetermined and cannot be calibrated after fabrication. The controller circuit retrieves the information from the code memory, the timer, the OTP or read-only memory cell, or the external Control Signals entering into the voltage signal pulse generator and modulates the signal outputs of the voltage signal pulse generator based on the information. Further, the definition and use of such key subblocks in the voltage signal pulse generator are well-known to those skilled in the art and shouldn't be limited to the specific description or forms described here.

Figure 10:
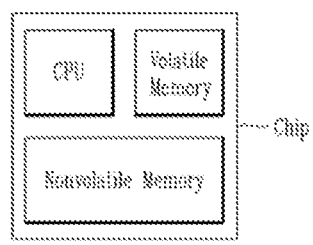
FIG. 10. illustrates a chip including a central processing unit (CPU), a volatile memory, and a nonvolatile memory deploying a pulse width control programming scheme according to an embodiment of the present invention.
Figure 1:
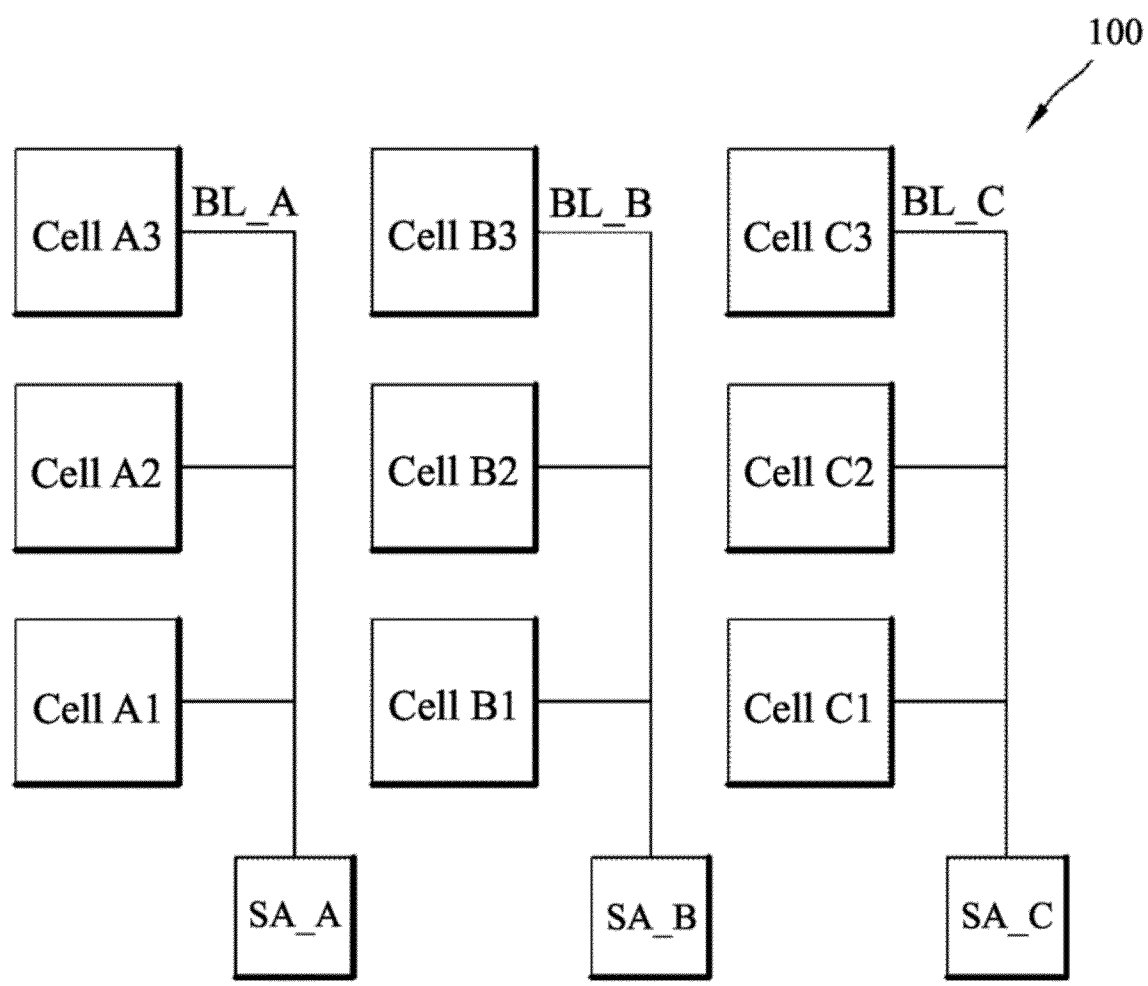
Figure 2A:
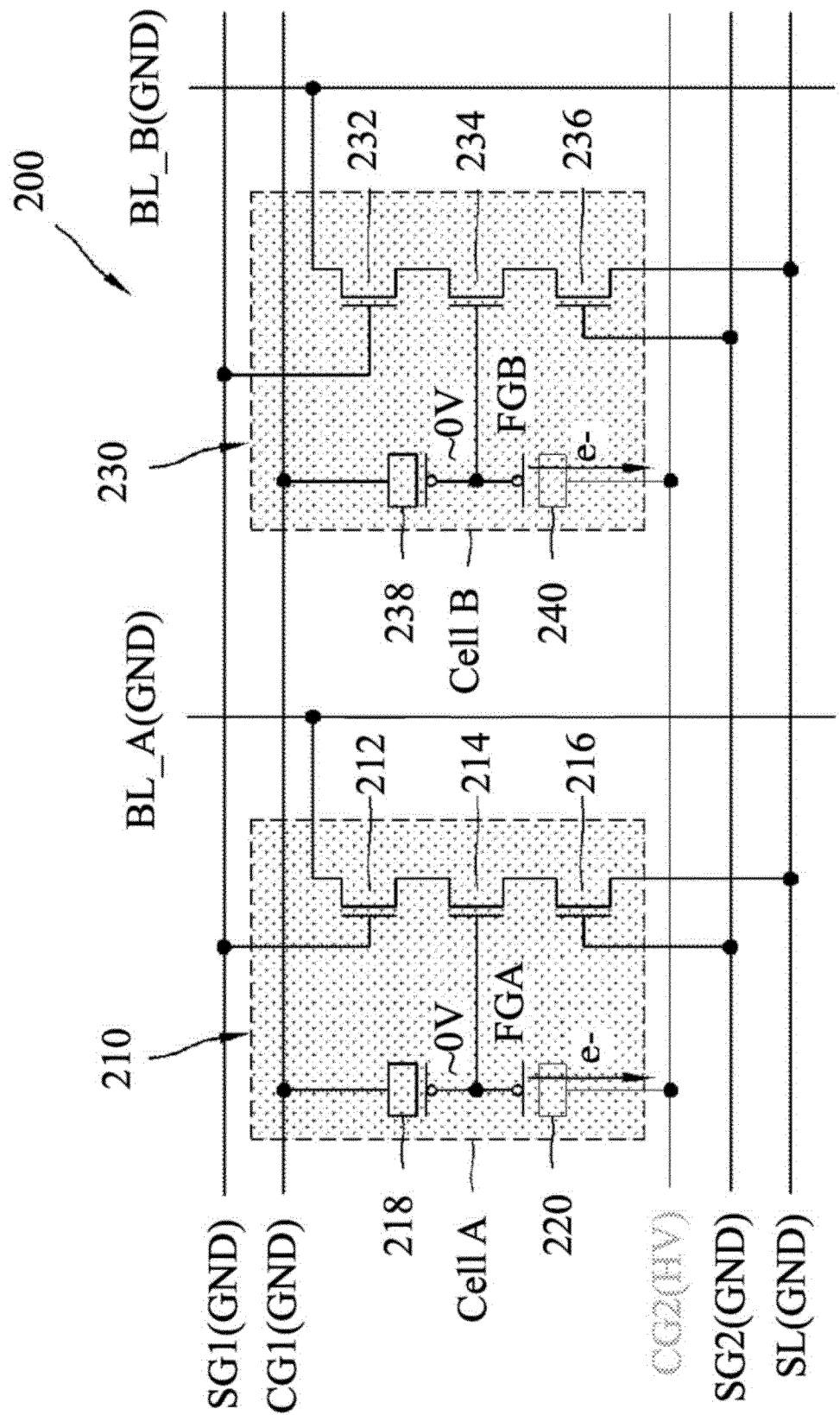
Figure 2B:
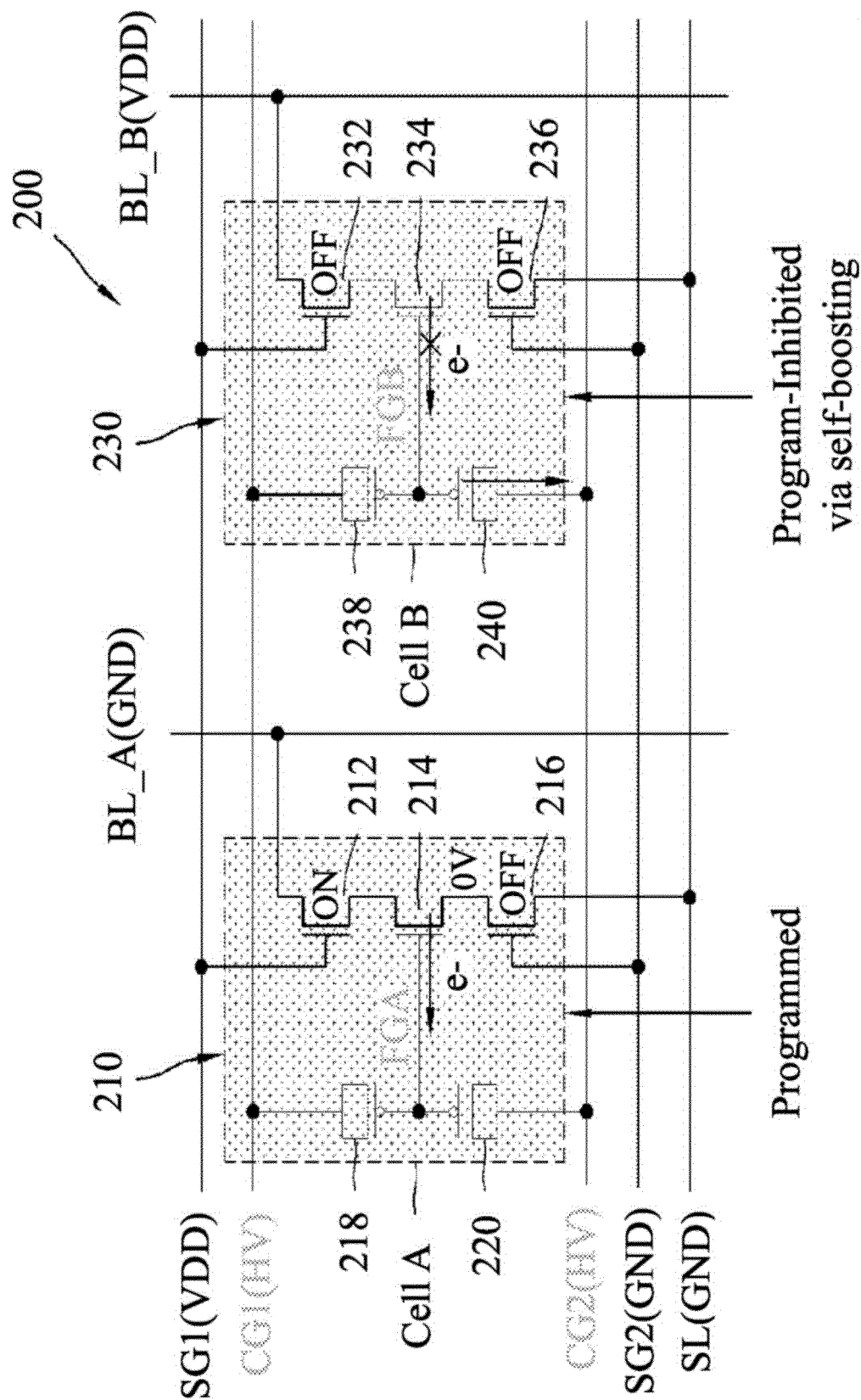

FIG. 10 shows an exemplary chip having various components such as a central processing unit (CPU), a volatile memory, and a nonvolatile memory deploying a pulse width control programming scheme according to the present invention. The nonvolatile memory cell can be made using standard logic devices, as depicted in FIG. 2. Thus, the entire chip can be built using a standard logic process without having any special fabrication process steps cost-effectively, while the nonvolatile memory cell can be accurately and efficiently programmed to the target levels with the aforementioned pulse width control programming scheme according to the present invention.

Although a nonvolatile memory cell with five logic devices (i.e., 212, 214, 216, 218, 220 in Cell A; 230, 232, 234, 236, 238, 240 in Cell B in FIG. 2) and five-row lines (i.e., SG1, SG2, CG1, CG2, SL in FIG. 2) is described in this disclosure, a skilled person in the art should be able to apply this invention to any other types of logic compatible non-volatile memory. Thus, the definition and use of the proposed invention shouldn't be limited to the specific description or forms of a logic compatible nonvolatile memory cell shown in this disclosure. While this invention is susceptible to various modifications and alternative forms, it should be understood, however, that the invention is not limited to the particular forms disclosed. While this invention is susceptible to various modifications and alternative forms, it should be understood, however, that the invention is not limited to the particular forms disclosed.

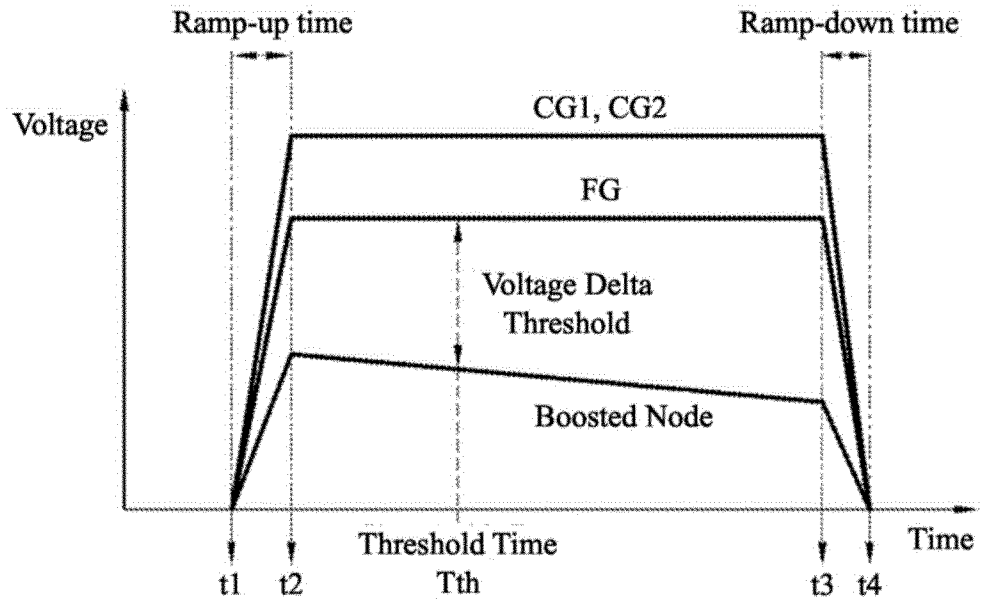

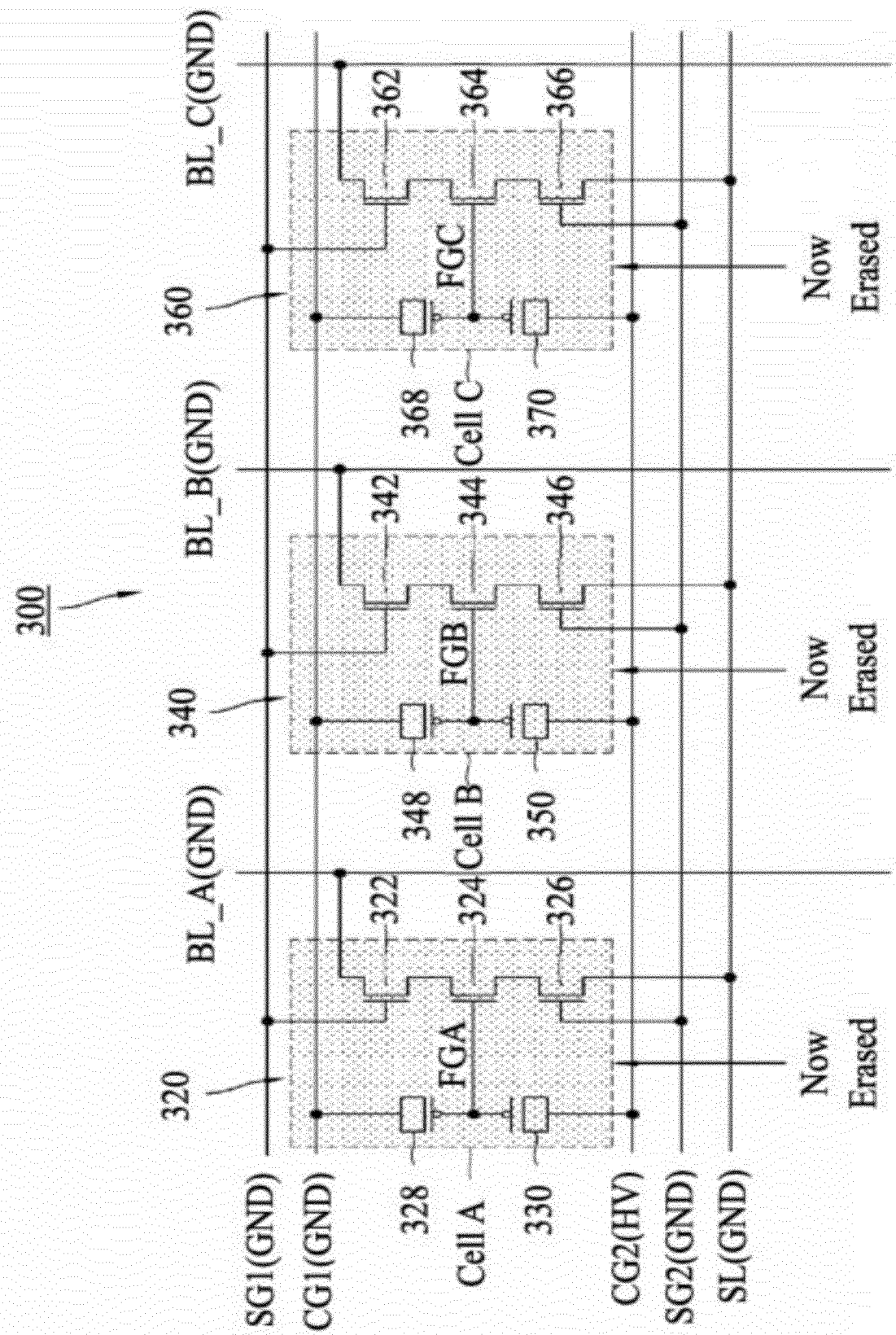

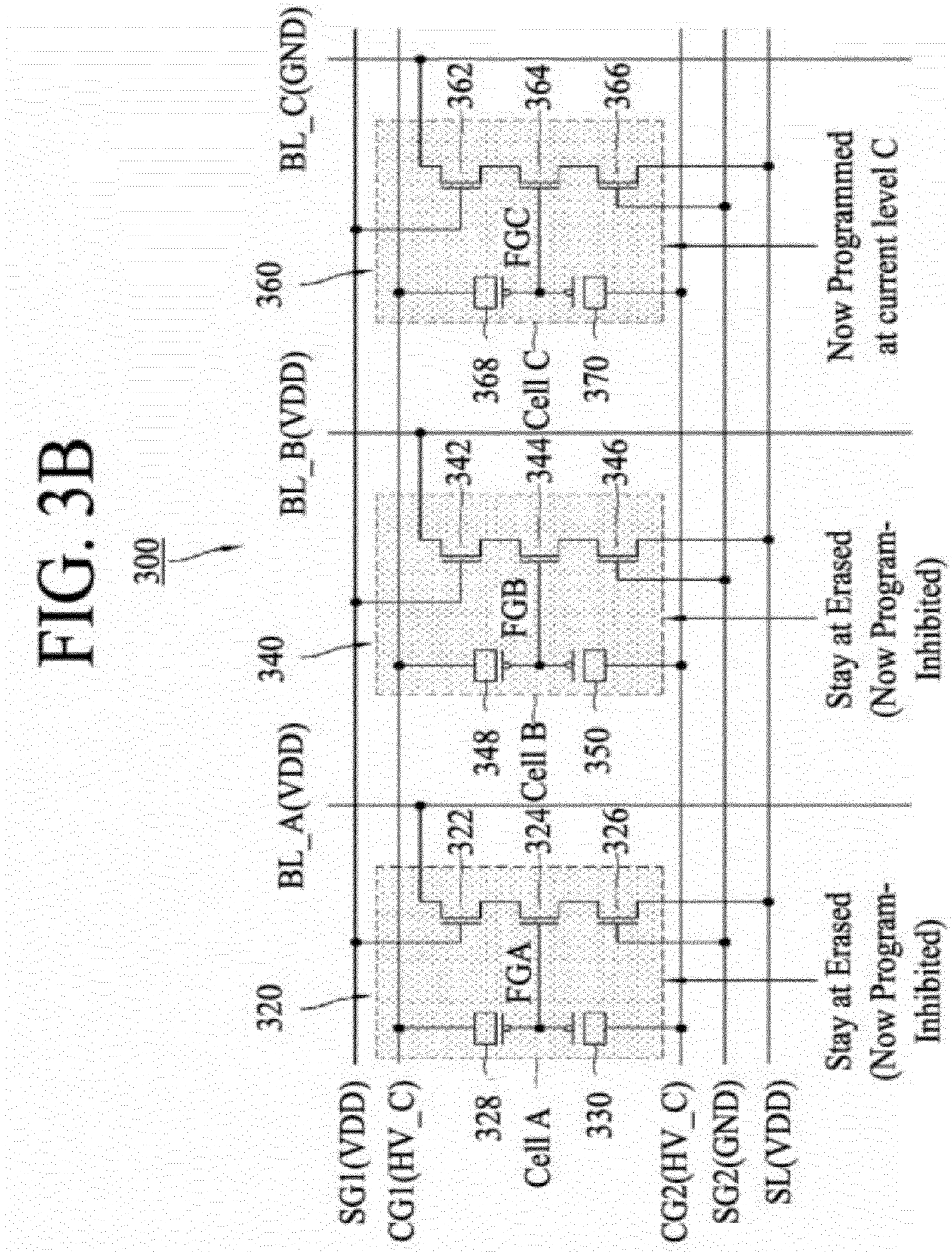

What is claimed is:

1. A method of programming a non-volatile memory cell in a memory array that is defined by input voltage lines and bitlines arranged in a flash memory device, the method comprising:
    applying a same programming voltage on a selected memory cell and an unselected memory cell, wherein a floating gate of the unselected memory cell can be charged with within a range specified;
    boosting a region of the unselected memory cell; and,
    setting a threshold programming time of to prevent the unselected memory cell from being inadvertently programmed by the programming voltage,
    wherein the threshold programming time is set equal to the time when a voltage difference between the floating gate and the boosted region of the unselected memory cell reaches a point at which the programming voltage is about to program the unselected memory cell after the application of the programming voltage; and
    wherein the threshold programming time is further set equal to the time when an absolute magnitude of the voltage difference between the floating gate and the boosted region of the unselected memory cell reaches a predetermined threshold value.

2. The method of claim 1, further comprising:
    applying a programming voltage having a duration that is about or less than the threshold programming time to the selected and unselected memory cells.

3. The method of claim 2, wherein the programming voltage begins to ramp down to a ground potential at or near the threshold time.

4. The method of claim 2, wherein the programming voltage is applied to a gate line connecting the selected memory cell and the unselected memory cell.

5. The method of claim 2, the duration of the programming voltage is maintained to be long enough after a ramp-up and before a ramp-down as long as the programming voltage is lowered to at or near the ground potential at or near the threshold programming time.

6. The method of claim 1, a degree of the unselected memory cell disturbed by the programming of the selected memory cell is limited or reduced within a range that a sense amplifier circuit connected to the cell in the memory array can output correct value.

7. The method of claim 6, wherein the threshold value is a maximum voltage difference between the floating gate and the boosted region of the unselected memory cell to prevent unwanted programming of the unselected memory cell.

8. The method of claim 6, wherein the boosted region of the unselected memory cell includes a source region, a drain region, and a channel region between the source and the drain regions of the unselected memory cell, formed on a corresponding substrate.

9. The method of claim 8, wherein the boosted region is boosted to a specific voltage level by a voltage potential on the floating gate of the unselected memory cell.

10. A non-volatile memory device comprising:
    a non-volatile memory cell array having a plurality of input voltage lines, a plurality of bitlines, and a plurality of memory cells organized into a memory block having a plurality of the input voltage lines and bitlines; and,
    a voltage signal pulse generator connected to the memory cell array, configured to apply a same programming voltage on a selected memory cell and an unselected memory cell within the memory block,
    wherein the programming voltage has a threshold programming time that is set equal to the time when a voltage difference between a floating gate of the unselected memory cell and a boosted region of the unselected memory cell reaches a point at which the programming voltage is about to program the unselected memory cell after the application of the programming voltage; and,
    wherein the threshold programming time is further set equal to the time when an absolute magnitude of a voltage difference between the floating gate and the boosted region of the unselected memory cell reaches a predetermined threshold value.

\* \* \* \* \*

UNITED STATES PATENT AND TRADEMARK OFFICE
CERTIFICATE OF CORRECTION

PATENT NO. : 11,694,751 B2
APPLICATION NO. : 16/951927
DATED : July 4, 2023
INVENTOR(S) : Song It is certified that error appears in the above-identified patent and that said Letters Patent is hereby corrected as shown below:

On the Title Page

Delete the title page and substitute therefore with the attached title page consisting of the corrected illustrative figure(s).

In the Drawings

Please replace FIGS. 1-10 with FIGS. 1-10 as shown on the attached pages.

Signed and Sealed this
Twelfth Day of November, 2024

Katherine Kelly Vidal
*Director of the United States Patent and Trademark Office*

(12) United States Patent
Song

(10) Patent No.: US 11,694,751 B2
(45) Date of Patent: Jul. 4, 2023

(54) LOGIC COMPATIBLE FLASH MEMORY PROGRAMMING WITH A PULSE WIDTH CONTROL SCHEME

(71) Applicant: Seung-Hwan Song, Palo Alto, CA (US)

(72) Inventor: Seung-Hwan Song, Palo Alto, CA (US)

(73) Assignee: SEMIBRAIN INC., Seongnam-si (KR)

(*) Notice: Subject to any disclaimer, the term of this patent is extended or adjusted under 35 U.S.C. 154(b) by 195 days.

(21) Appl. No.: 16/951,927

(22) Filed: Nov. 18, 2020

(65) Prior Publication Data
US 2021/0166763 A1   Jun. 3, 2021

Related U.S. Application Data

(60) Provisional application No. 62/942,086, filed on Nov. 30, 2019.

(51) Int. Cl.
*G11C 16/34* (2006.01)
*G11C 16/10* (2006.01)

(52) U.S. Cl.
CPC .......... *G11C 16/10* (2013.01); *G11C 16/3459* (2013.01)

(58) Field of Classification Search
CPC .................................................. G11C 16/3427
See application file for complete search history.

(56) References Cited

U.S. PATENT DOCUMENTS

2012/0081962 A1* 4/2012 Tsai ................. G11C 16/3427
365/185.15

\* cited by examiner

*Primary Examiner* — Jason Lappas

(57) ABSTRACT

A selective non-volatile memory programming method for a selected memory cell in a memory array is described so as to reduce or avoid program disturbance on an unselected memory cell. This selective programming method comprises: applying a programming pulse to a selected memory cell to be programmed and an unselected memory cell, wherein the programming pulse allows a change of the unselected memory cell within a range specified; boosting a region of the unselected memory cell; and setting a threshold time of the programming pulse, wherein the threshold time is defined when an absolute magnitude of a voltage difference between a floating gate of the unselected memory cell and the boosted region of the unselected memory cell reaches a threshold value defined.

10 Claims, 16 Drawing Sheets